(12) United States Patent
Kanamori et al.

(10) Patent No.: US 10,971,238 B2
(45) Date of Patent: Apr. 6, 2021

(54) THREE-DIMENSIONAL SEMICONDUCTOR MEMORY DEVICES AND METHODS OF OPERATING THE SAME

(71) Applicant: Samsung Electronics Co., Ltd., Suwon-si (KR)

(72) Inventors: Kohji Kanamori, Seongnam-si (KR); Yongseok Kim, Suwon-si (KR); Kyunghwan Lee, Hwaseong-si (KR); Junhee Lim, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/714,941

(22) Filed: Dec. 16, 2019

(65) Prior Publication Data

US 2020/0303410 A1 Sep. 24, 2020

(30) Foreign Application Priority Data

Mar. 20, 2019 (KR) ........................ 10-2019-0031961

(51) Int. Cl.
| | |
|---|---|
| *G11C 16/34* | (2006.01) |
| *G11C 16/04* | (2006.01) |
| *H01L 27/11582* | (2017.01) |
| *H01L 27/11565* | (2017.01) |
| *H01L 27/11573* | (2017.01) |
| *G11C 16/14* | (2006.01) |
| *G11C 16/10* | (2006.01) |
| *G11C 16/26* | (2006.01) |

(52) U.S. Cl.
CPC ...... *G11C 16/3427* (2013.01); *G11C 16/0483* (2013.01); *H01L 27/11565* (2013.01); *H01L 27/11573* (2013.01); *H01L 27/11582* (2013.01); *G11C 16/10* (2013.01); *G11C 16/14* (2013.01); *G11C 16/26* (2013.01)

(58) Field of Classification Search
CPC ......... H01L 27/11582; H01L 27/11573; H01L 27/11565; G11C 16/0483; G11C 16/26; G11C 16/10; G11C 16/14
See application file for complete search history.

(56) References Cited

U.S. PATENT DOCUMENTS

| | | | |
|---|---|---|---|
| 9,177,613 | B2 | 11/2015 | Lee et al. |
| 9,236,340 | B2 | 1/2016 | Lee et al. |

(Continued)

*Primary Examiner* — Ajay Ojha
(74) *Attorney, Agent, or Firm* — Myers Bigel, P.A.

(57) ABSTRACT

Three-dimensional semiconductor memory devices are provided. A three-dimensional semiconductor memory device includes a plurality of word line blocks including a plurality of cell strings that are connected in parallel between a bit line and a common source line. Each of the cell strings includes a plurality of memory cell transistors that are stacked on a substrate in a vertical direction, a plurality of ground selection transistors that are connected in series between the plurality of memory cell transistors and the substrate, and a string selection transistor that is between the plurality of memory cell transistors and the bit line. In each of the cell strings, at least one of the plurality of ground selection transistors has a first threshold voltage, and remaining ones of the ground selection transistors have a second threshold voltage different from the first threshold voltage. Related methods of operating three-dimensional semiconductor memory devices are also provided.

20 Claims, 21 Drawing Sheets

(56) References Cited

U.S. PATENT DOCUMENTS

| | | |
|---|---|---|
| 9,331,095 B2 * | 5/2016 | Shim .................. G11C 16/0408 |
| 9,666,592 B2 | 5/2017 | Yun et al. |
| 9,978,454 B2 | 5/2018 | Jung |
| 9,991,271 B2 | 6/2018 | Kang et al. |
| 10,043,816 B2 | 8/2018 | Taekyung et al. |
| 2014/0092686 A1 * | 4/2014 | Shim ................. H01L 27/11556 365/185.17 |
| 2016/0232973 A1 * | 8/2016 | Jung ...................... G11C 16/08 |
| 2018/0137925 A1 * | 5/2018 | Nam ...................... G11C 16/10 |
| 2018/0308856 A1 | 10/2018 | Cho et al. |
| 2018/0337054 A1 | 11/2018 | Sung et al. |
| 2018/0374961 A1 | 12/2018 | Kim et al. |

* cited by examiner

FIG. 20

|  | CS1 | CS2 | CS3 | CS4 | CS5 | CS6 |
|---|---|---|---|---|---|---|
| GST3 | Vth2 | Vth2 | Vth1 | Vth1 | Vth1 | Vth1 |
| GST2 | Vth1 | Vth1 | Vth2 | Vth2 | Vth1 | Vth1 |
| GST1 | Vth1 | Vth1 | Vth1 | Vth1 | Vth2 | Vth2 |

FIG. 21

| Selected SSL | | SSL1/2 | SSL3/4 | SSL5/6 |
|---|---|---|---|---|
| Selected GSL | GSL1c | Vgsl2 | Vgsl1 | Vgsl1 |
| | GSL1b | Vgsl1 | Vgsl2 | Vgsl1 |
| | GSL1a | Vgsl1 | Vgsl1 | Vgsl2 |
| Unselected GSL | GSL2a/GSL2b/GSL2c | Vgsl1 | Vgsl1 | Vgsl1 |

THREE-DIMENSIONAL SEMICONDUCTOR MEMORY DEVICES AND METHODS OF OPERATING THE SAME

CROSS-REFERENCE TO RELATED APPLICATION

This U.S. non-provisional patent application claims priority under 35 U.S.C. § 119 to Korean Patent Application No. 10-2019-0031961, filed on Mar. 20, 2019, in the Korean Intellectual Property Office, the entire contents of which are hereby incorporated by reference.

BACKGROUND

The present disclosure relates to semiconductor memory devices and methods of operating the same. Higher integration of semiconductor devices may be used to satisfy consumer demands for superior performance and inexpensive prices. In the case of semiconductor devices, since their integration is an important factor in determining product prices, increased integration may be especially beneficial. To meet such technical demands, three-dimensional semiconductor memory devices including three-dimensionally arranged memory cells have recently been proposed.

SUMMARY

Some embodiments of the inventive concepts provide a three-dimensional semiconductor memory device with an increased integration density.

Some embodiments of the inventive concepts provide a three-dimensional semiconductor memory device with improved reliability.

According to some embodiments of the inventive concepts, a three-dimensional (3D) semiconductor memory device may include a plurality of word line blocks including a plurality of cell strings that are connected in parallel between a bit line and a common source line. Each of the cell strings may include a plurality of memory cell transistors that are stacked on a substrate in a vertical direction, a plurality of ground selection transistors that are connected in series between the plurality of memory cell transistors and the substrate, and a string selection transistor that is between the plurality of memory cell transistors and the bit line. In each of the word line blocks, the string selection transistors of the cell strings may be electrically separated from each other, and ones of the ground selection transistors that are located at a same vertical level may be controlled in common. Moreover, in each of the cell strings, at least one of the plurality of ground selection transistors may have a first threshold voltage, and remaining ones of the ground selection transistors may have a second threshold voltage different from the first threshold voltage.

According to some embodiments of the inventive concepts, a 3D semiconductor memory device may include a substrate. The 3D semiconductor memory device may include first and second cell strings connected in common to a bit line. Each of the first and second cell strings may include: a plurality of memory cell transistors that are stacked on the substrate in a vertical direction; first and second ground selection transistors that are connected in series between the plurality of memory cell transistors and the substrate; and a string selection transistor that is between the plurality of memory cell transistors and the bit line. The 3D semiconductor memory device may include a first string selection line connected to the string selection transistor of the first cell string. The 3D semiconductor memory device may include a second string selection line connected to the string selection transistor of the second cell string. The 3D semiconductor memory device may include a first ground selection line connected in common to the first ground selection transistors of the first and second cell strings. The 3D semiconductor memory device may include a second ground selection line connected in common to the second ground selection transistors of the first and second cell strings. Moreover, in each of the first and second cell strings, the first and second ground selection transistors may have respective threshold voltages that are different from each other.

According to some embodiments of the inventive concepts, a 3D semiconductor memory device may include a substrate. The 3D semiconductor memory device may include a cell electrode structure including word lines vertically stacked on the substrate. The cell electrode structure may include a plurality of word line blocks that each include: a plurality of ground selection electrodes vertically stacked between the cell electrode structure and the substrate; and a plurality of string selection electrodes that are on the cell electrode structure and are horizontally spaced apart from each other. The 3D semiconductor memory device may include a plurality of vertical semiconductor patterns penetrating the cell electrode structure, the ground selection electrodes, and the string selection electrodes. Moreover, the 3D semiconductor memory device may include data storage patterns between the ground selection electrodes and the vertical semiconductor patterns.

According to some embodiments of the inventive concepts, a method of operating a three-dimensional semiconductor memory device that includes first, second, and third ground selection transistors is provided. The method may include increasing a threshold voltage of the third ground selection transistor higher than that of the first and second ground selection transistors, in a first cell string of the three-dimensional semiconductor memory device. The method may include increasing a threshold voltage of the second ground selection transistor higher than that of the first and third ground selection transistors, in a second cell string of the three-dimensional semiconductor memory device. The method may include then increasing a threshold voltage of the first ground selection transistor higher than that of the second and third ground selection transistors, in a third cell string of the three-dimensional semiconductor memory device. The first, second, and third cell strings may be connected in parallel between a bit line and a common source line of the three-dimensional semiconductor memory device. Moreover, each of the first, second, and third cell strings may include: a plurality of memory cell transistors stacked on a substrate in a vertical direction; the first, second, and third ground selection transistors connected in series between the plurality of memory cell transistors and the substrate; and a string selection transistor between the plurality of memory cell transistors and the bit line.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 20 is a table showing threshold voltages of the ground selection transistors, in the three-dimensional semiconductor memory device of FIG. 10.

FIG. 21 is a table showing voltage conditions for programming and reading operations of the three-dimensional semiconductor memory device of FIG. 10.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

A three-dimensional semiconductor memory device and a method of operating the same, according to example embodiments of the inventive concept will now be described more fully with reference to the accompanying drawings, in which example embodiments are shown.

Figure 1:
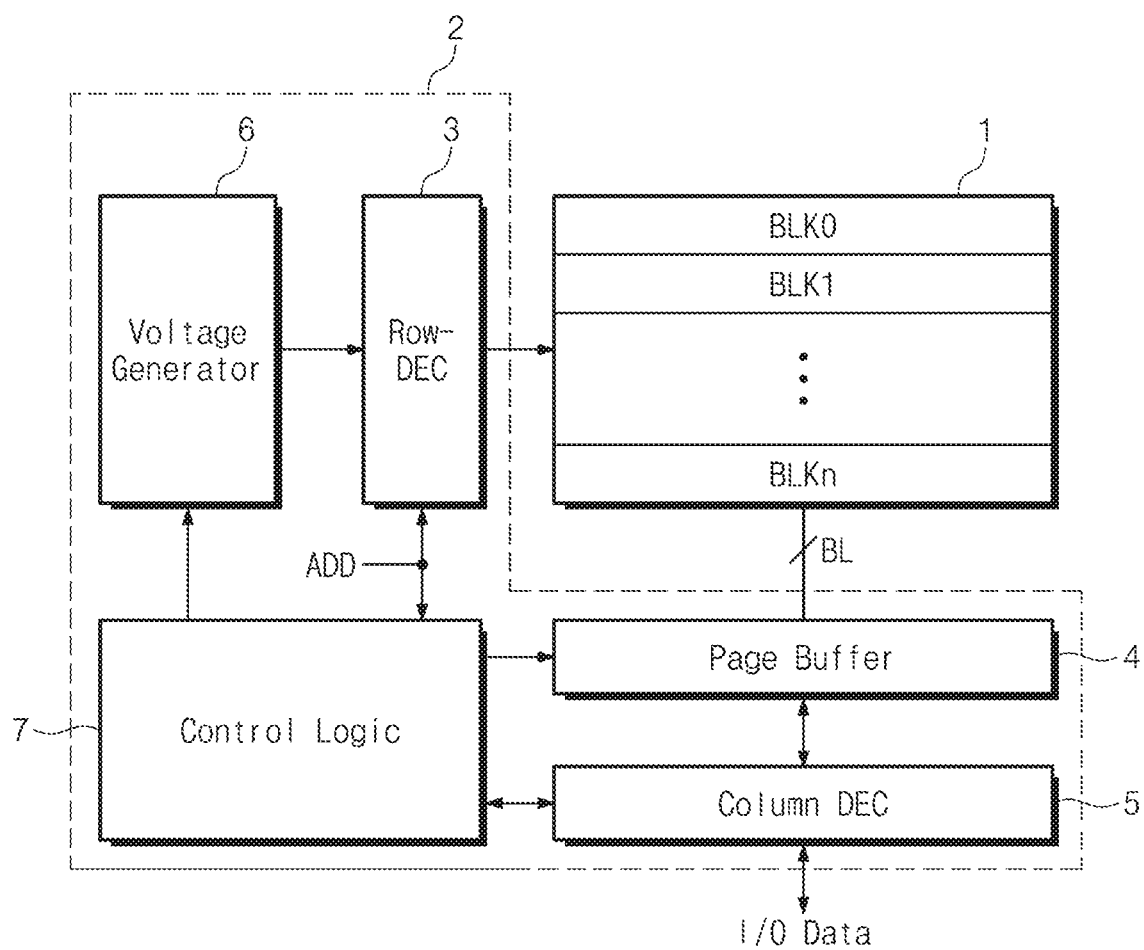
FIG. 1 is a diagram schematically illustrating a structure of a three-dimensional semiconductor memory device according to some embodiments of the inventive concepts.

FIG. 1 is a diagram schematically illustrating a structure of a three-dimensional semiconductor memory device according to some embodiments of the inventive concepts.

Referring to FIG. 1, a three-dimensional semiconductor memory device may include a memory cell array 1 and a peripheral circuit 2 controlling the memory cell array 1. The peripheral circuit 2 may include a row decoder 3, a page buffer 4, a column decoder 5, a voltage generator 6, and a control (e.g., control logic) circuit 7.

The memory cell array 1 may include a plurality of memory blocks BLK0-BLKn, each of which includes a plurality of memory cells that are three-dimensionally arranged. In some embodiments, the memory blocks BLK0-BLKn may include a plurality of cell strings constituting a NAND-type cell array. The memory blocks BLK0-BLKn may be connected to the row decoder 3 through word lines and selection lines.

The row decoder 3 may decode an address ADD, which is input from outside of the peripheral circuit 2 and/or from outside of the memory device, to select one of the memory blocks BLK0-BLKn and select one of the word lines of the selected memory block. The page buffer 4 may be connected to the memory cell array 1 through the bit lines BL and may read out data stored in the memory cells. The column decoder 5 may decode an address, which is input from outside of the peripheral circuit 2 and/or from outside of the memory device, to select one of the bit lines BL. The column decoder 5 may provide data-transmission paths (e.g., for input/output (I/O) data) between the page buffer 4 and an external device (e.g., a memory controller). The voltage generator 6 may generate voltages (e.g., program voltage, read voltage, erase voltage, and so forth), which are used for internal operations of the memory cell array 1, according to the control of the control circuit 7.

Figure 2:
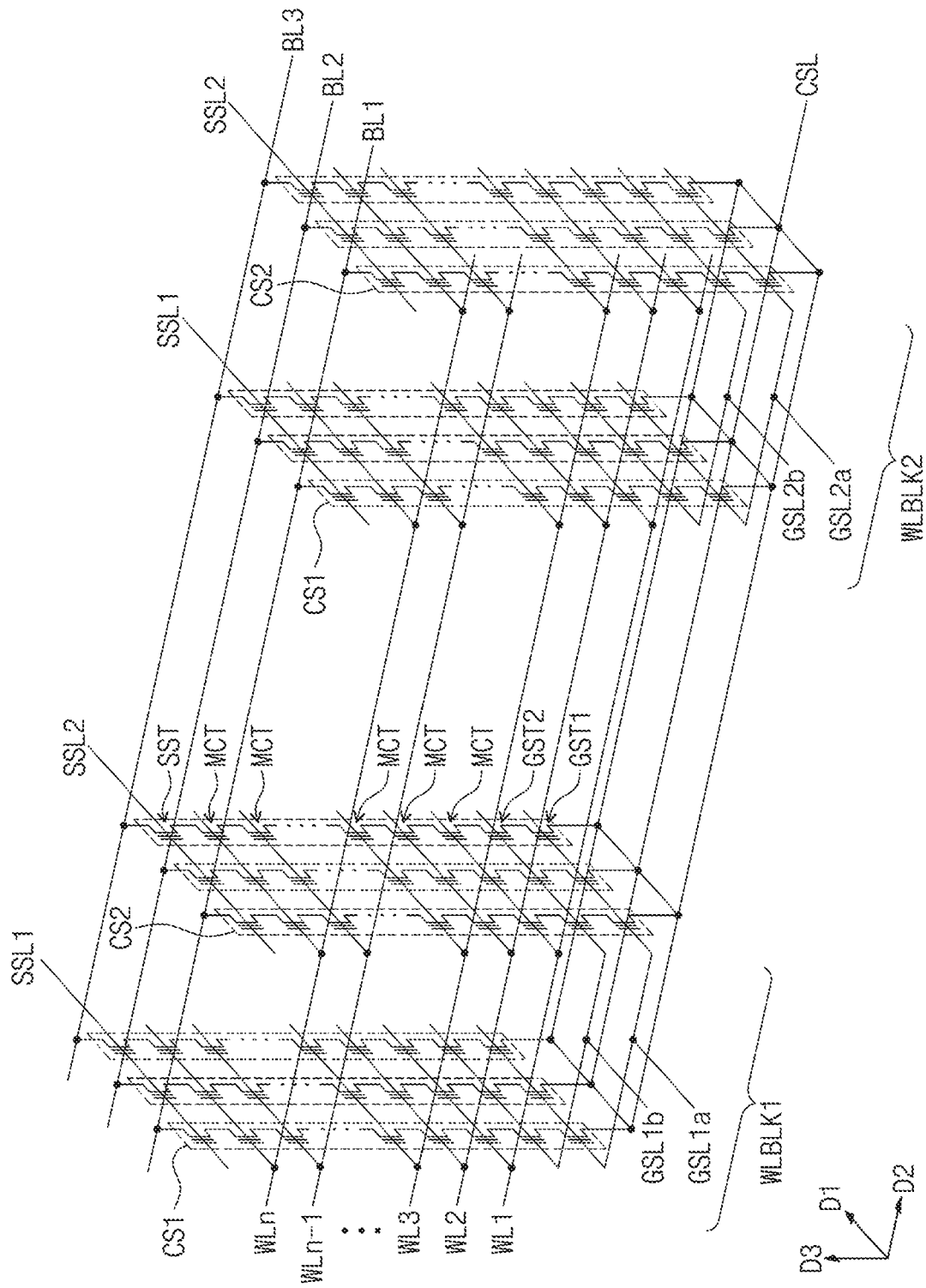
FIG. 2 is a circuit diagram illustrating a cell array of a three-dimensional semiconductor memory device according to some embodiments of the inventive concepts.

FIG. 2 is a circuit diagram illustrating a cell array of a three-dimensional semiconductor memory device according to some embodiments of the inventive concepts.

Referring to FIG. 2, the cell array of the three-dimensional semiconductor memory device may include a plurality of memory blocks, each of which includes a plurality of word line blocks WLBLK1 and WLBLK2. As an example, each memory block may include first and second word line blocks WLBLK1 and WLBLK2. In some embodiments, each memory block is illustrated to include two word line blocks WLBLK1 and WLBLK2, but the inventive concept is not limited to this example.

Each of the first and second word line blocks WLBLK1 and WLBLK2 may include cell strings CS1 and CS2, which are two-dimensionally arranged in first and second directions D1 and D2 crossing each other and are extended in a third direction D3. The cell strings CS1 and CS2 may be connected in parallel to each of bit lines BL1-BL3. The cell strings CS1 and CS2, which are two-dimensionally arranged, may be connected in common to a common source line CSL.

In each of the first and second word line blocks WLBLK1 and WLBLK2, the first and second cell strings CS1 and CS2 may be connected in parallel to each of the bit lines BL1-BL3.

Each of the first and second cell strings CS1 and CS2 may include a plurality of memory cell transistors MCT, which are connected in series to each other in the third direction D3, a plurality of ground selection transistors GST1 and GST2, which are connected in series to each other between the common source line CSL and the memory cell transistors MCT, and a string selection transistor SST, which is provided between the memory cell transistors MCT and one of the bit lines BL1-BL3.

In some embodiments, each of the first and second word line blocks WLBLK1 and WLBLK2 may include two string selection lines (e.g., first and second string selection lines SSL1 and SSL2), which are electrically separated from each other. The first string selection line SSL1 may control the string selection transistors SST of the first cell strings CS1, which are arranged in the first direction D1. The second string selection line SSL2 may control the string selection transistors SST of the second cell strings CS2, which are arranged in the first direction D1.

The bit lines BL1-BL3, the word lines WL1-WLn, and the common source line CSL may be provided in common in the first and second word line blocks WLBLK1 and WLBLK2. First lower and upper ground selection lines GSL1a and GSL1b may be provided in the first word line block WLBLK1, and second lower and upper ground selection lines GSL2a and GSL2b may be provided in the second word line block WLBLK2. In some embodiments, the first lower and upper ground selection lines GSL1a and GSL1b may be first and second ground selection electrodes, respectively. Similarly, the second lower and upper ground selection lines GSL2a and GSL2b may be first and second (or third and fourth) ground selection electrodes, respectively.

The memory cell transistors MCT may be controlled by the word lines WL1-WLn. In the first and second word line blocks WLBLK1 and WLBLK2, gate electrodes of the memory cell transistors MCT, which are located at the same level from the common source line CSL, may be connected in common to one of the word lines WL1-WLn. Each of the memory cell transistors MCT may include a data storage element. A "cell electrode structure" may comprise a stack of the word lines WL1-WLn on a substrate, and/or may comprise the first and second word line blocks WLBLK1 and WLBLK2.

In some embodiments, in the case where each of the first and second word line blocks WLBLK1 and WLBLK2 includes a pair of the first and second string selection lines SSL1 and SSL2, which are electrically separated from each other, each of the cell strings CS1 and CS2 may include a pair of ground selection transistors GST1 and GST2. In other words, each of the cell strings CS1 and CS2 may include first and second ground selection transistors GST1 and GST2, which are connected in series to each other. In each of the cell strings CS1 and CS2, the first ground selection transistor GST1 and the second ground selection transistor GST2 may have threshold voltages different from each other.

The first and second ground selection transistors GST1 and GST2 of the first word line block WLBLK1 may be controlled by the first lower and upper ground selection lines GSL1a and GSL1b. The first and second ground selection transistors GST1 and GST2 of the second word line block WLBLK2 may be controlled by the second lower and upper ground selection lines GSL2a and GSL2b. The first lower and upper ground selection lines GSL1a and GSL1b may be electrically separated from the second lower and upper ground selection lines GSL2a and GSL2b.

The first lower ground selection line GSL1a may be electrically connected in common to the first ground selection transistors GST1 of the first word line block WLBLK1. The first upper ground selection line GSL1b may be electrically connected in common to the second ground selection transistors GST2 of the first word line block WLBLK1.

The second lower ground selection line GSL2a may be electrically connected in common to the first ground selection transistors GST1 of the second word line block WLBLK2. The second upper ground selection line GSL2b may be electrically connected in common to the second ground selection transistors GST2 of the second word line block WLBLK2.

Figure 3:
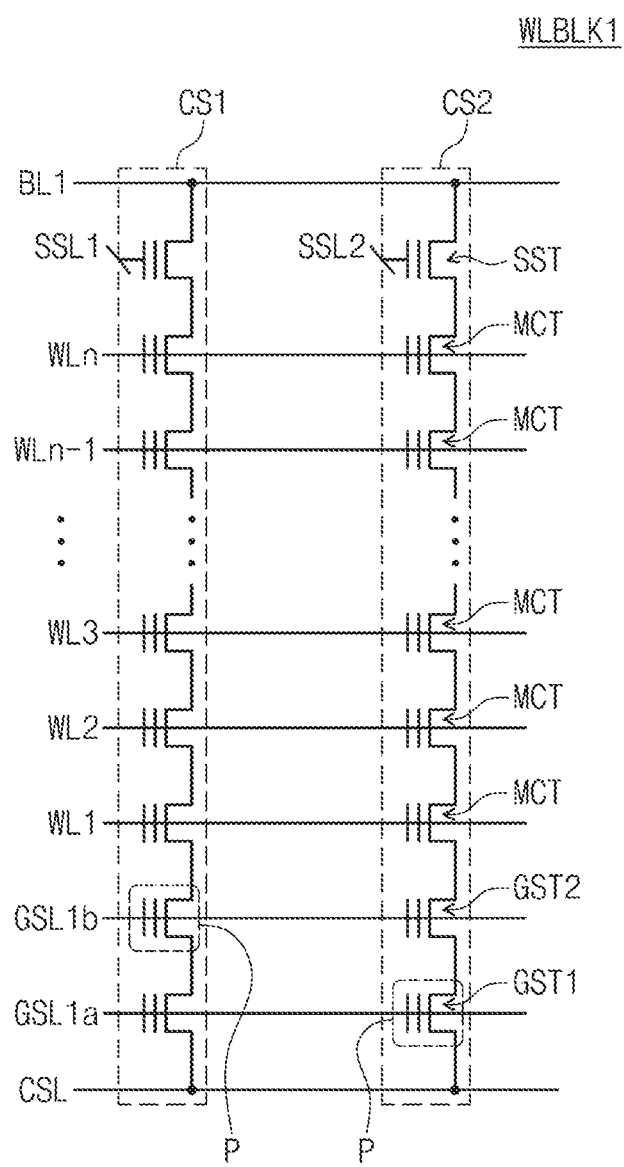
FIG. 3 is a circuit diagram illustrating cell strings of the three-dimensional semiconductor memory device of FIG. 2.

FIG. 3 is a circuit diagram illustrating cell strings of the three-dimensional semiconductor memory device of FIG. 2.

Referring to FIG. 3, the first and second cell strings CS1 and CS2 may be connected in parallel to one (e.g., BL1) of the bit lines and the common source line CSL.

The string selection transistor SST of the first cell string CS1 may be controlled by the first string selection line SSL1, and the string selection transistor SST of the second cell string CS2 may be controlled by the second string selection line SSL2.

In each of the first and second cell strings CS1 and CS2, the first and second ground selection transistors GST1 and GST2 may be programmed to have different threshold voltages. In FIG. 3, the reference letters 'P' represent the ground selection transistors GST1 and GST2, which are programmed to have a second threshold voltage.

In the first cell string CS1, the first ground selection transistor GST1 may have a first threshold voltage, and the second ground selection transistor GST2 may have a second threshold voltage higher than the first threshold voltage. In the second cell string CS2, the first ground selection transistor GST1 may have the second threshold voltage, and the second ground selection transistor GST2 may have the first threshold voltage. In other words, the first ground selection transistors GST1 of the first and second cell strings CS1 and CS2 may have threshold voltages different from each other, and the second ground selection transistors GST2 of the first and second cell strings CS1 and CS2 may have threshold voltages different from each other.

The first ground selection transistor GST1 of the first cell string CS1 and the second ground selection transistor GST2 of the second cell string CS2 may be turned on by a first operation voltage, which is higher than the first threshold voltage and lower than the second threshold voltage. The second ground selection transistor GST2 of the first cell string CS1 and the first ground selection transistor GST1 of the second cell string CS2 may be turned on by a second operation voltage higher than the second threshold voltage.

In some embodiments, the first ground selection transistors GST1 of the first and second cell strings CS1 and CS2, which are connected in common to the first lower ground selection line GSL1a, may be operated in a mutually complementary manner, in accordance with a voltage applied to the first lower ground selection line GSL1a. Also, the second ground selection transistors GST2 of the first and second cell strings CS1 and CS2, which are connected in common to the first upper ground selection line GSL1b, may be operated in a mutually complementary manner, in accordance with a voltage applied to the first upper ground selection line GSL1b.

An electric connection between the first bit line BL1 and the first and second cell strings CS1 and CS2 may be controlled by voltages applied to the first and second string selection lines SSL1 and SSL2. An electric connection between the first and second cell strings CS1 and CS2 and the common source line CSL may be controlled by voltages applied to the first lower and upper ground selection lines GSLa and GSL1b.

In some embodiments, for the first and second cell strings CS1 and CS2 connected to the first bit line BL1, the first lower and upper ground selection lines GSL1a and GSL1b are physically connected in common to the first and second cell strings CS1 and CS2, but the first and second ground selection transistors GST1 and GST2 of the first and second cell strings CS1 and CS2 may be electrically separated from each other.

In detail, a power voltage $V_{CC}$ (FIG. 18) may be applied to the first string selection line SSL1, a ground voltage may be applied to the second string selection line SSL2, a second operation voltage may be applied to the first upper ground selection line GSL1b, and a first operation voltage may be applied to the first lower ground selection line GSL1a. In this case, the first bit line BL1 and the common source line CSL may be electrically connected to each other through the first cell string CS1, but the second cell string CS2 may be electrically separated from the first bit line BL1 and the common source line CSL and may be in a floating state. In other words, the unselected second cell string CS2 may be electrically separated from the first bit line BL1 and the common source line CSL. Thus, during the reading operation on the cell array, it may be possible to inhibit/prevent a read disturbance phenomenon from occurring in an unselected one (e.g., CS2) of the cell strings CS1 and CS2, which are connected to the selected one (e.g., BL1) of the bit lines.

Figure 4:
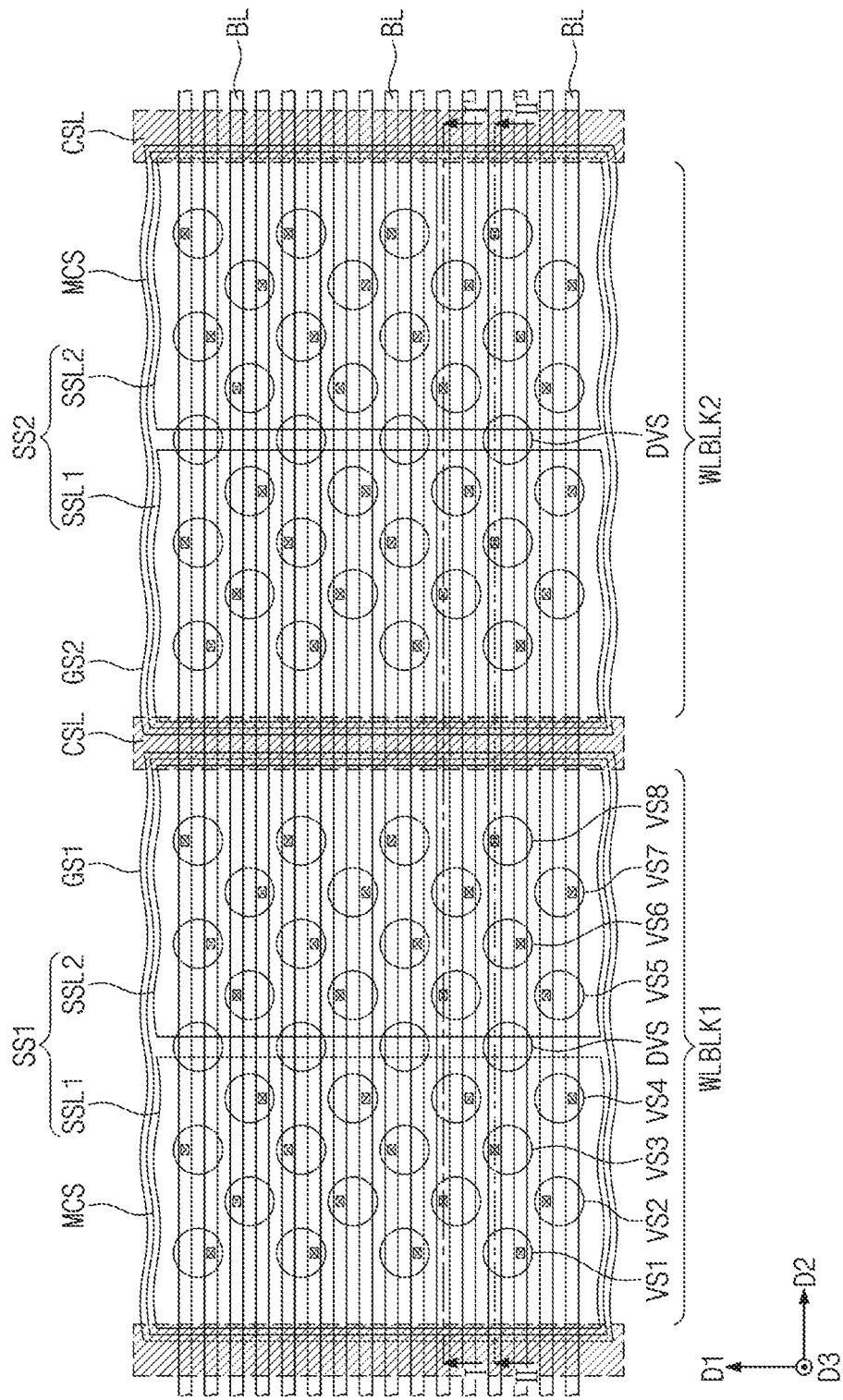
FIG. 4 is a plan view illustrating the cell array of the three-dimensional semiconductor memory device of FIG. 2.
Figure 5A:
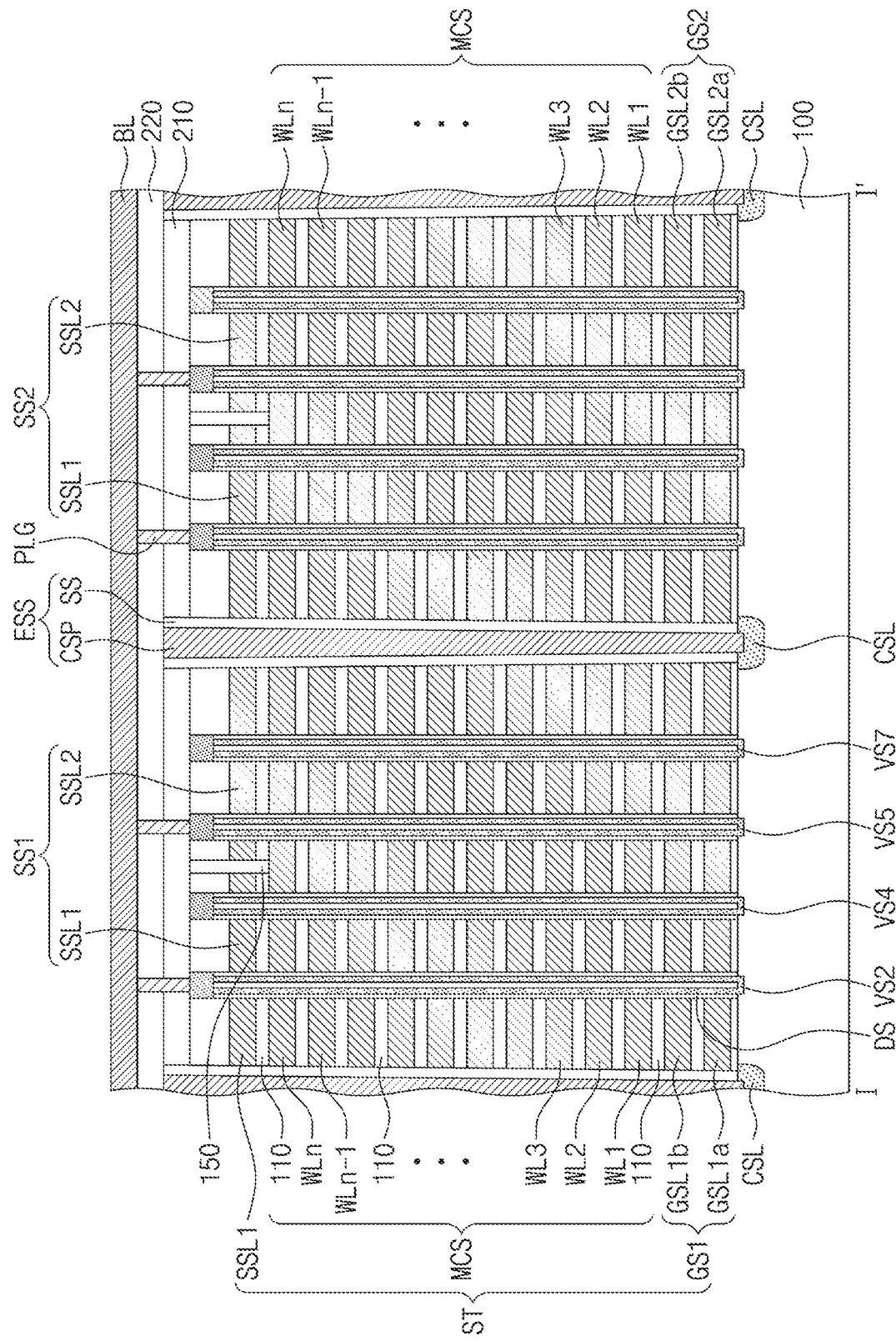
FIGS. 5A and 5B are sectional views taken along lines I-I' and respectively, of FIG. 4.
Figure 5B:
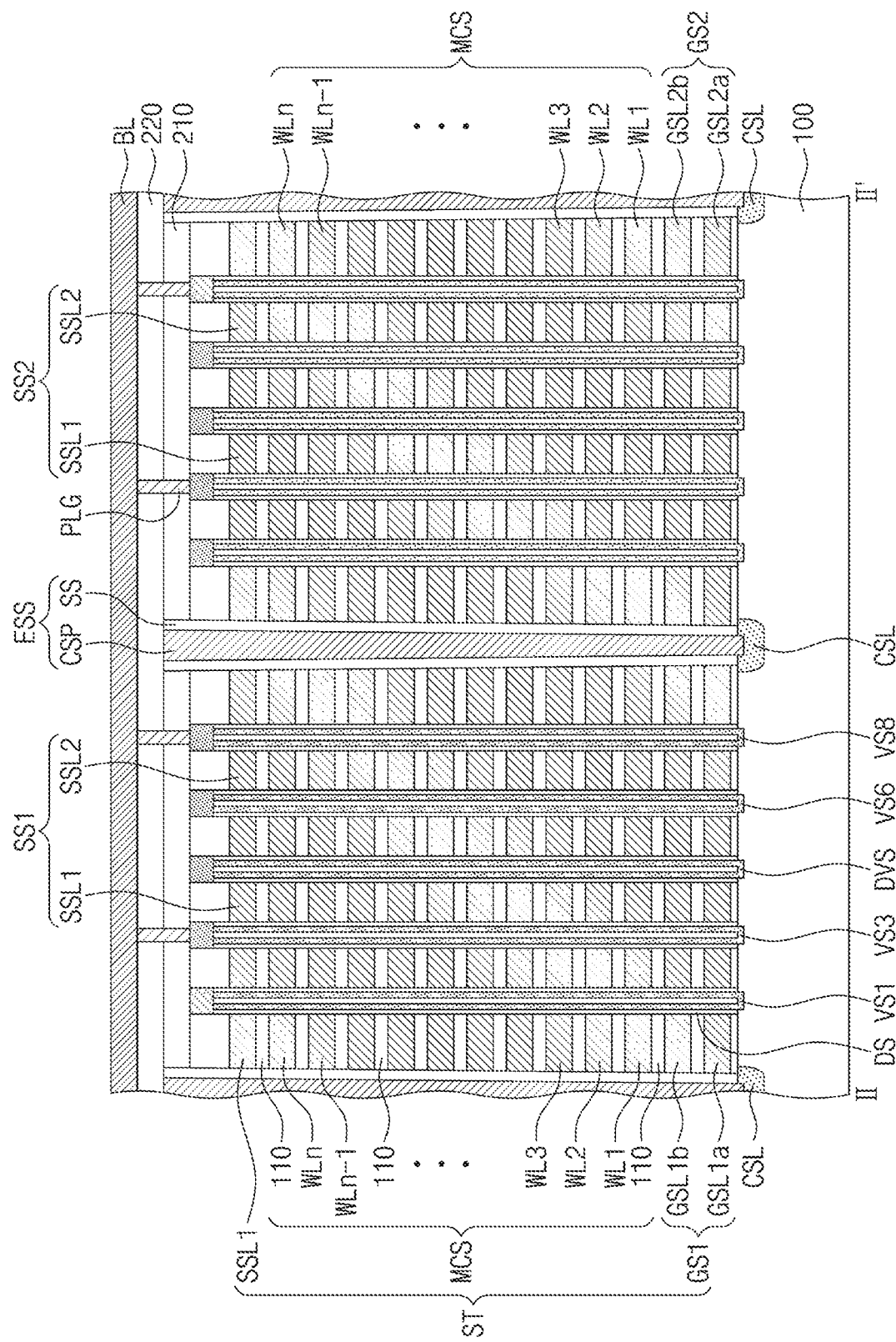

FIG. 4 is a plan view illustrating the cell array of the three-dimensional semiconductor memory device of FIG. 2. FIGS. 5A and 5B are sectional views taken along lines I-I' and respectively, of FIG. 4.

Referring to FIGS. 4, 5A, and 5B, electrode structures ST may be disposed on a substrate 100. The substrate 100 may include at least one of a semiconductor material (e.g., silicon), an insulating material (e.g., glass), or a semiconductor or conductive material covered with an insulating material. For example, the substrate 100 may be a silicon wafer of a first conductivity type.

The electrode structures ST may extend in the first direction D1 that is parallel to a top surface of the substrate 100. The electrode structures ST may be spaced apart from each other, in the second direction D2 crossing the first direction D1, by an electrode separation structure ESS provided between them.

In each of the electrode structures ST, the string selection lines SSL1 and SSL2, the word lines WL1-WLn, and the ground selection lines GSL1a, GSL1b, GSL2a, and GSL2b may be stacked in the third direction D3 with insulating layers 110, which are respectively interposed therebetween. The third direction D3 may be vertical to the top surface of the substrate 100 and may be vertical to the first and second directions D1 and D2. In each of the electrode structures ST, ground selection lines GSL1a and GSL1b/GSL2a and GSL2b and the word lines WL1-WLn may have a first width in the second direction D2, and the string selection lines SSL1 and SSL2 may have a second width smaller than the first width, in the second direction D2.

Each of the electrode structures ST may include a ground selection structure GS1 or GS2, a memory cell structure MCS on the ground selection structure GS1 or GS2, and a string selection structure SS1 or SS2 on the memory cell structure MCS.

The ground selection structure GS1 or GS2 may include the ground selection lines GSL1a and GSL1b/GSL2a and GSL2b, which are stacked in the third direction D3, and the string selection structure SS1 or SS2 may include the string selection lines SSL1 and SSL2, which extend in the first direction D1 and are spaced apart from each other in the second direction D2. As an example, each electrode structure ST may include the first and second ground selection lines GSL1a, GSL1b, GSL2a, and GSL2b and the first and second string selection lines SSL1 and SSL2. The first and second string selection lines SSL1 and SSL2 may be spaced apart from each other by an insulating separation pattern 150, which is provided between them and is extended in the first direction D1.

The memory cell structure MCS may include the word lines WL1-WLn, which are stacked in the third direction D3. The memory cell structure MCS may be provided in common in a plurality of electrode structures ST. That is, in the plurality of electrode structures ST, the word lines WL1-WLn, which are located at the same level from the substrate 100, may be in an electrically equipotential state. In the plurality of electrode structures ST, ones of the word line WL1-WLn that are located at the same level from the substrate 100 may be formed of a physically single layer.

Bit lines BL may be connected in common to the plurality of electrode structures ST. The bit lines BL may be spaced apart from each other in the first direction D1 and may be extended in the second direction D2.

Common source lines/regions CSL may be provided in the substrate 100 between the electrode structures ST. As an example, the common source lines/regions CSL may be formed by doping the substrate 100 of the first conductivity type with impurities of a second conductivity type and may, for example, include n-type impurities (e.g., arsenic (As) or phosphorus (P)). The common source lines/regions CSL may be extended parallel to the electrode structures ST (e.g., in the first direction D1) and may be spaced apart from each other in the second direction D2. In other words, each of the electrode structures ST may be disposed between each adjacent pair of the common source lines/regions CSL.

The electrode separation structure ESS may be extended parallel to the electrode structures ST (e.g., in the first direction D1) and may be disposed between each adjacent pair of the electrode structures ST. The electrode separation structure ESS may include a common source plug CSP, which is coupled to each common source line/region CSL, and an insulating spacer SS, which is disposed between the common source plug CSP and side surfaces of the ground selection lines GSL1a, GSL1b, GSL2a, and GSL2b, the word lines WL1-WLn, and the string selection lines SSL1 and SSL2.

In some embodiments, first to eighth vertical structures VS1-VS8 may be provided to penetrate each of the electrode structures ST and may be connected to the substrate 100. In other words, the first to eighth vertical structures VS1-VS8 may be extended in the third direction D3 that is perpendicular to the top surface of the substrate 100. The first to eighth vertical structures VS1-VS8 may be arranged in respective columns, each of which includes a plurality of vertical structures and is extended in the first direction D1. The columns of the first to eighth vertical structures VS1-VS8 may be sequentially disposed along the second direction D2. Furthermore, the first to eighth vertical structures VS1-VS8 may be arranged in the first and second directions D1 and D2 to form a zigzag pattern, when viewed in a plan view.

The first to fourth vertical structures VS1-VS4 may penetrate the first string selection line SSL1 and the word lines WL1-WLn of each of the electrode structures ST. In the first word line block WLBLK1, the first to fourth vertical structures VS1-VS4 may further penetrate the first ground selection lines GSL1a and GSL1b. In the second word line block WLBLK2, the first to fourth vertical structures VS1-VS4 may further penetrate the second ground selection lines GSL2a and GSL2b. The fifth to eighth vertical structures VS5-VS8 may penetrate the second string selection line SSL2 and the word lines WL1-WLn of each of the electrode structures ST. In the first word line block WLBLK1, the fifth to eighth vertical structures VS5-VS8 may further penetrate the first ground selection lines GSL1a and GSL1b. In the second word line block WLBLK2, the fifth to eighth vertical structures VS5-VS8 may further penetrate the second ground selection lines GSL2a and GSL2b.

In addition, dummy vertical structures DVS may be provided to penetrate each of electrode structures ST, between the first and second string selection lines SSL1 and SSL2. The dummy vertical structures DVS may be configured to have substantially the same structural features as the first to eighth vertical structures VS1-VS8.

Each of the first to eighth vertical structures VS1-VS8 may include a conductive pad provided at a top thereof, and the conductive pad may be an impurity region, which is doped with impurities, or may be formed of a conductive material.

Each of the first to eighth vertical structures VS1-VS8 and the dummy vertical structures DVS may include a vertical semiconductor pattern VP (e.g., see FIG. 19), which is connected to the substrate 100, and a data storage pattern DS, which surrounds the vertical semiconductor pattern VP. In other words, the data storage pattern DS may be disposed on an outer sidewall of the vertical semiconductor pattern VP.

The vertical semiconductor pattern VP (e.g., see FIG. 19) may include a semiconductor material and may be used as channel regions of the first and second ground selection transistors GST1 and GST2, the string selection transistors SST, and the memory cell transistors MCT described with reference to FIG. 3.

Figure 19:
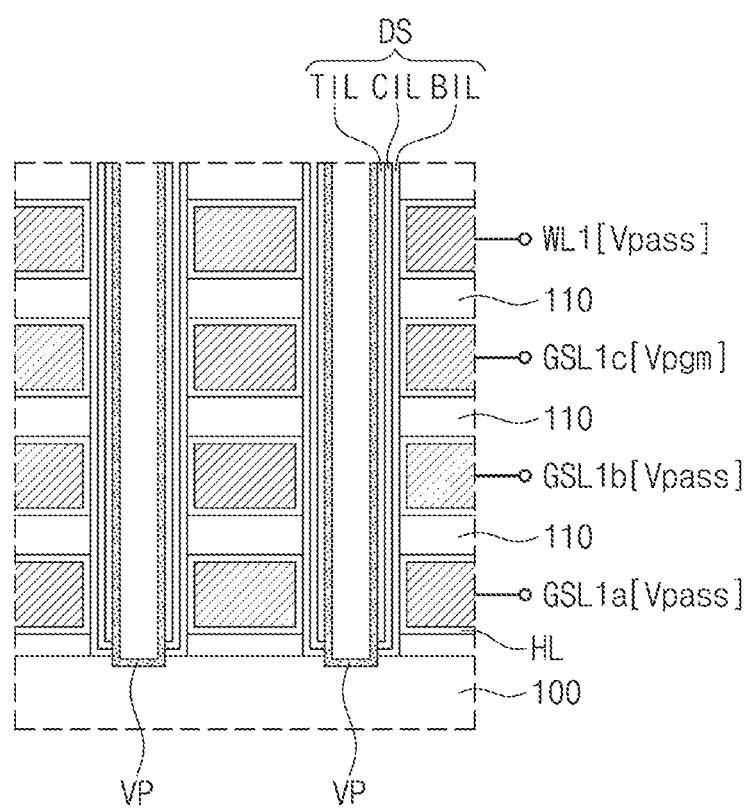
FIG. 19 is a diagram illustrating a method of determining a threshold voltage of ground selection transistors, in a three-dimensional semiconductor memory device according to some embodiments of the inventive concepts.

The data storage pattern DS may include a charge storing layer, which is used as a data storing element of a NAND FLASH memory device. As an example, the data storage pattern DS may include a tunnel insulating layer TIL, a charge storing layer CIL, and a blocking insulating layer BIL, as shown in FIG. 19. The charge storing layer CIL may be one or more insulating layers with abundant trap sites and/or one or more insulating layers with nano particles. For example, the charge storing layer CIL may include one of a trap insulating layer, a floating gate electrode, or an insulating layer with conductive nano dots.

In some embodiments, the data storage pattern DS may be extended in the third direction D3 to cross side surfaces of the first and second ground selection lines GSL1a, GSL1b, GSL2a, and GSL2b, the word lines WL1-WLn, and the first and second string selection lines SSL1 and SSL2. The first and second ground selection transistors GST1 and GST2 described with reference to FIG. 3 may be composed of the first and second ground selection lines GSL1a, GSL1b, GSL2a, and GSL2b as well as the data storage pattern DS and the vertical semiconductor pattern VP adjacent thereto. Since each of the first and second ground selection transistors GST1 and GST2 includes the data storage pattern DS, they may be programmed by voltages applied to the first and second ground selection lines GSL1a, GSL1b, GSL2a, and GSL2b. In detail, electric charges may be trapped in the data storage pattern DS of the first and second ground selection transistors GST1 and GST2, by the Fowler-Nordheim (FN) tunneling caused by a voltage difference between the first and second ground selection lines GSL1a, GSL1b, GSL2a, and GSL2b and the vertical semiconductor pattern VP (e.g., see FIG. 19). This may enable the first and second ground selection transistors GST1 and GST2 to have different respective threshold voltages. A method of programming the first and second ground selection transistors GST1 and GST2 to different threshold voltages will be described in more detail below.

Furthermore, referring to FIGS. 5A, 5B, and 19, a horizontal insulating pattern HL may be horizontally extended from a region, which is between the vertical semiconductor pattern VP and the side surfaces of the string selection lines SSL1 and SSL2, the word lines WL1-WLn, and the ground selection lines GSL1a, GSL1b, GSL2a, and GSL2b to cover top and bottom surfaces of each of the lines SSL1, SSL2, WL1-WLn, GSL1a, GSL1b, GSL2a, and GSL2b. The horizontal insulating pattern HL may be used as a part of a data-storing layer for a NAND FLASH memory device. The horizontal insulating pattern HL may be formed of or include at least one of high-k dielectric materials (e.g., aluminum oxide and/or hafnium oxide), which have a dielectric constant lower than the blocking insulating layer BIL.

A capping insulating pattern 210 may be disposed on the electrode structures ST to cover top surfaces of the first to eighth vertical structures VS1-VS8. An interlayer insulating layer 220 may be disposed on a capping insulating pattern 210 and may cover a top surface of the common source plug CSP.

The bit lines BL may be disposed on the interlayer insulating layer 220. The bit lines BL may be extended in the second direction D2 to cross the electrode structures ST and may be alternately disposed in the first direction D1. In some embodiments, a pair of the bit lines BL may cross over each of the vertical structures VS1-VS8, when viewed in a plan view. In other words, the bit lines BL may have a line width that is smaller than half of an upper width of the vertical structure VS1-VS8. The bit lines BL may be selectively connected to the first to eighth vertical structures VS1-VS8 through contact plugs PLG.

In some embodiments, the three-dimensional semiconductor memory device may be the vertical-type NAND FLASH memory device described with reference to FIG. 3. In other words, the word lines WL1-WLn, the first and second string selection lines SSL1 and SSL2, and the first and second ground selection lines GSL1a, GSL1b, GSL2a, and GSL2b of the electrode structures ST may control electric potentials of the vertical semiconductor patterns VP (e.g., see FIG. 19) of the first to eighth vertical structures VS1-VS8 and may control an electric connection between the bit line BL and the common source line/region CSL.

For concise description, an element, which is the same as that of the three-dimensional semiconductor memory device described with reference to FIGS. 2 to 5B, may be identified by the same reference number without repeating an overlapping description thereof.

Figure 6:
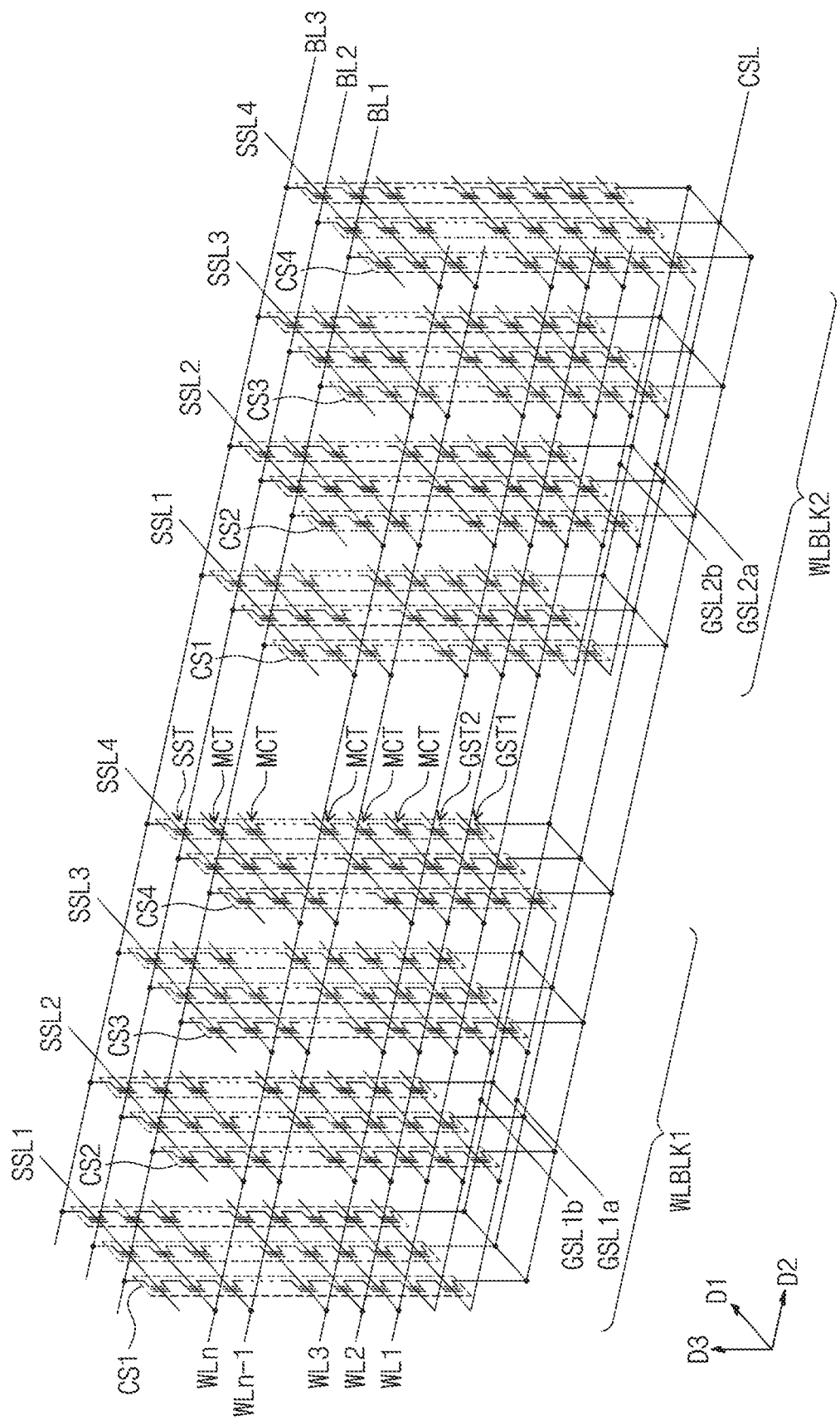
FIG. 6 is a circuit diagram illustrating a cell array of a three-dimensional semiconductor memory device according to some embodiments of the inventive concepts.
Figure 7:
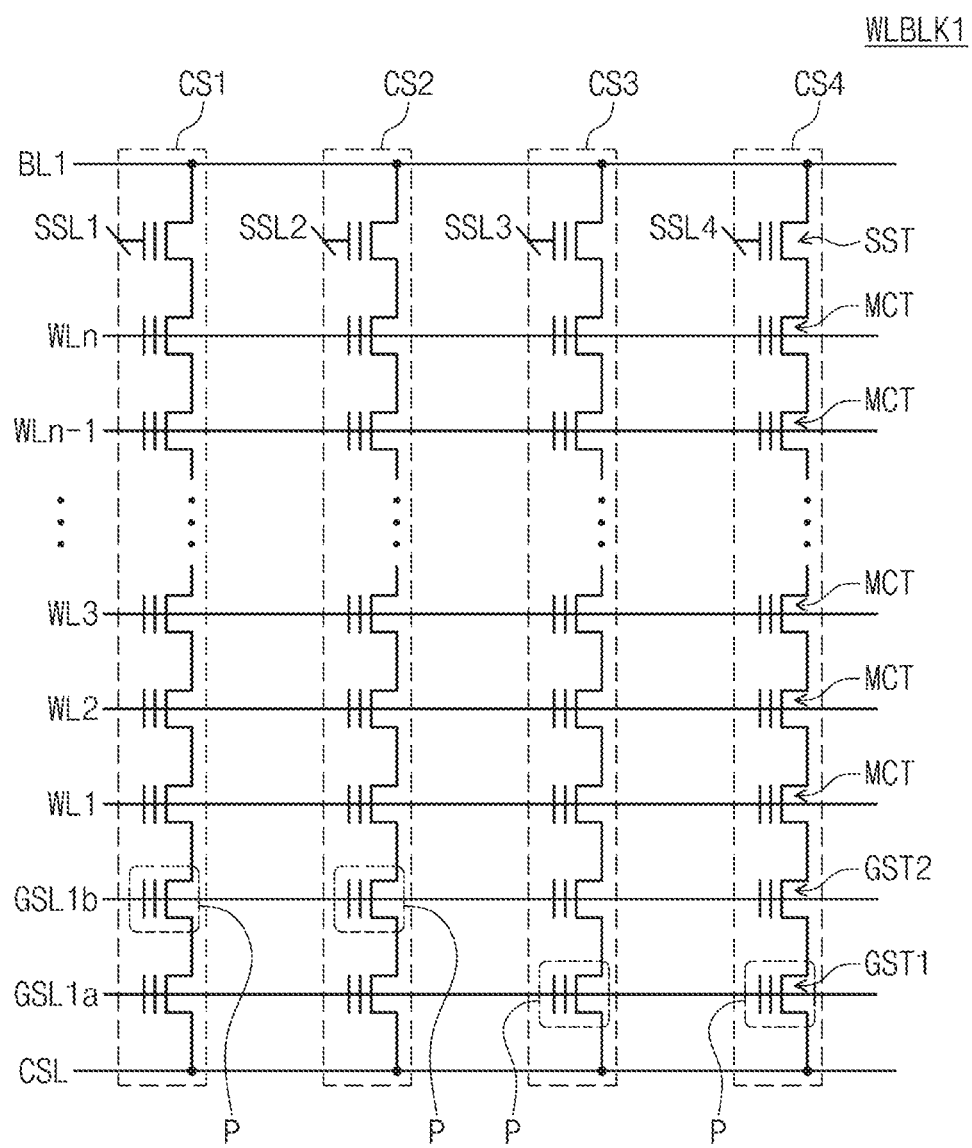
FIG. 7 is a circuit diagram illustrating cell strings of the three-dimensional semiconductor memory device of FIG. 6.

FIG. 6 is a circuit diagram illustrating a cell array of a three-dimensional semiconductor memory device according to some embodiments of the inventive concepts. FIG. 7 is a circuit diagram illustrating cell strings of the three-dimensional semiconductor memory device of FIG. 6.

Referring to FIGS. 6 and 7, the cell array may include the first and second word line blocks WLBLK1 and WLBLK2.

In each of the first and second word line blocks WLBLK1 and WLBLK2, first, second, third, and fourth cell strings CS1, CS2, CS3, and CS4 may be connected in parallel to each of the bit lines BL. Each of the first to fourth cell strings CS1-CS4 may include the string selection transistor SST, the memory cell transistors MCT connected in series, and a plurality of ground selection transistors GST1 and GST2 connected in series. As an example, each of the first to fourth cell strings CS1-CS4 may include two or four ground selection transistors GST1 and GST2. Furthermore, in at least one of the cell strings CS1-CS4, the ground selection transistors GST1 and GST2 may have two different threshold voltages.

In some embodiments, each of the first to fourth cell strings CS1-CS4 may include the first and second ground selection transistors GST1 and GST2, which are connected in series to each other. In each of the first to fourth cell strings CS1-CS4, the first ground selection transistor GST1 and the second ground selection transistor GST2 may be programmed to have different threshold voltages from each other.

The first lower and upper ground selection lines GSL1*a* and GSL1*b* may be provided in the first word line block WLBLK1, and the second lower and upper ground selection lines GSL2*a* and GSL2*b* may be provided in the second word line block WLBLK2. In the first word line block WLBLK1, the first ground selection transistors GST1 may be electrically connected in common to the first lower ground selection line GSL1*a*, and the second ground selection transistors GST2 may be electrically connected in common to the first upper ground selection line GSL1*b*. In the second word line block WLBLK2, the first ground selection transistors GST1 may be electrically connected in common to the second lower ground selection line GSL2*a*, and the second ground selection transistors GST2 may be electrically connected in common to the second upper ground selection line GSL2*b*.

In some embodiments, the first ground selection transistors GST1 of the first and second cell strings CS1 and CS2 may have a first threshold voltage, and the second ground selection transistors GST2 of the first and second cell strings CS1 and CS2 may have a second threshold voltage higher than the first threshold voltage. The first ground selection transistors GST1 of the third and fourth cell strings CS3 and CS4 may have the second threshold voltage, and the second ground selection transistors GST2 of the third and fourth cell strings CS3 and CS4 may have the first threshold voltage. In this case, when the first bit line BL1 is selected and the first cell string CS1 is electrically connected to the first bit line BL1 and the common source line CSL, the string selection transistor SST and the first and second ground selection transistors GST1 and GST2 of the unselected third and fourth cell strings CS3 and CS4 may be turned off, and thus, the common source line CSL and the first bit line BL1 may be electrically disconnected from each other.

In some embodiments, the first ground selection transistors GST1 of the first and third cell strings CS1 and CS3 may have a first threshold voltage, and the second ground selection transistors GST2 of the first and third cell strings CS1 and CS3 may have a second threshold voltage higher than the first threshold voltage. The first ground selection transistors GST1 of the second and fourth cell strings CS2 and CS4 may have the second threshold voltage, and the second ground selection transistors GST2 of the second and fourth cell strings CS2 and CS4 may have the first threshold voltage. In this case, when the first bit line BL1 is selected and the first cell string CS1 is electrically connected to the first bit line BL1 and the common source line CSL, the unselected second and fourth cell strings CS2 and CS4 may be electrically disconnected from the common source line CSL and the first bit line BL1. In other words, the unselected second and fourth cell strings CS2 and CS4 may be in an electrically floating state.

Figure 8:
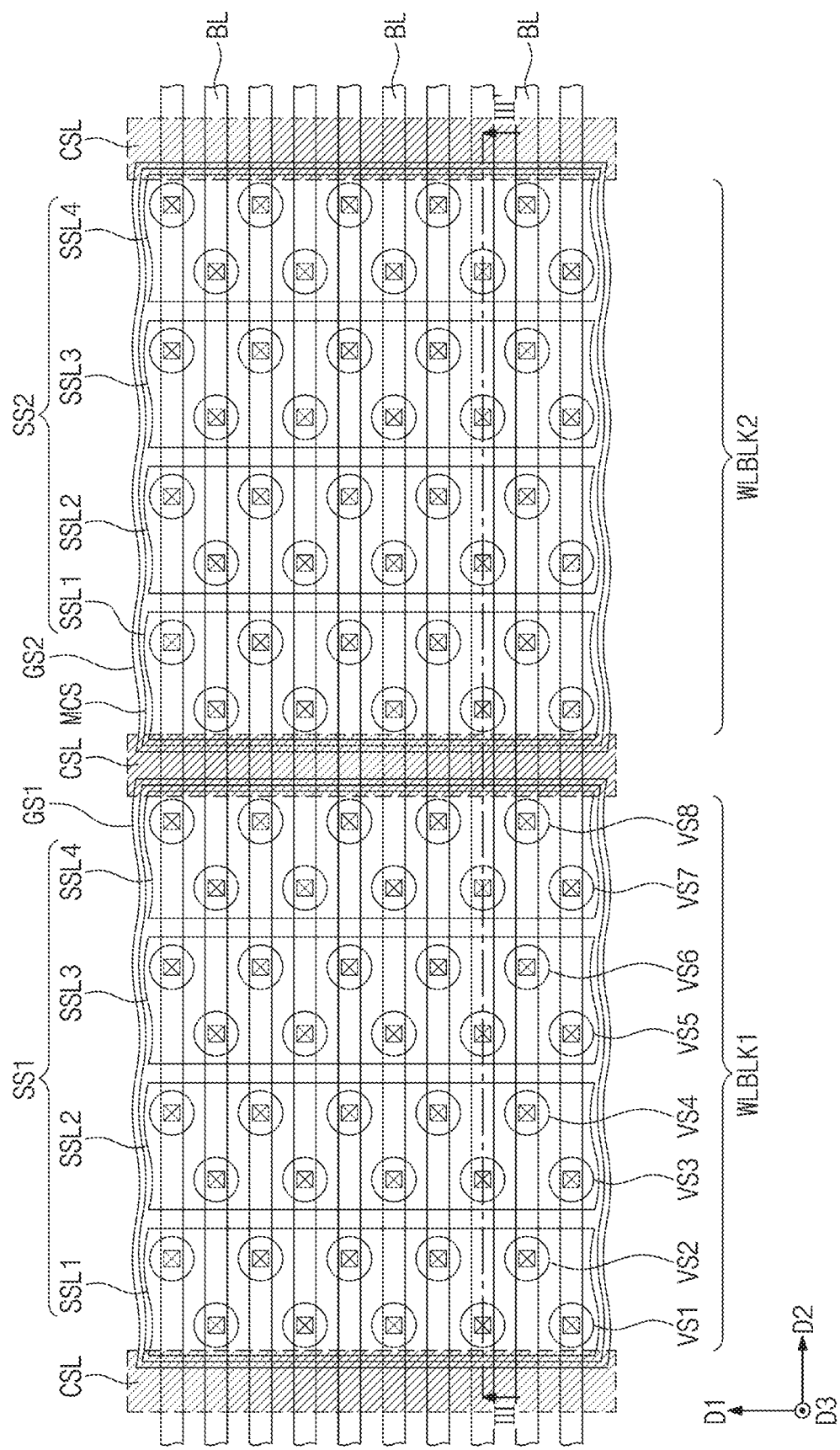
FIG. 8 is a plan view illustrating the cell array of the three-dimensional semiconductor memory device of FIG. 6.
Figure 9:
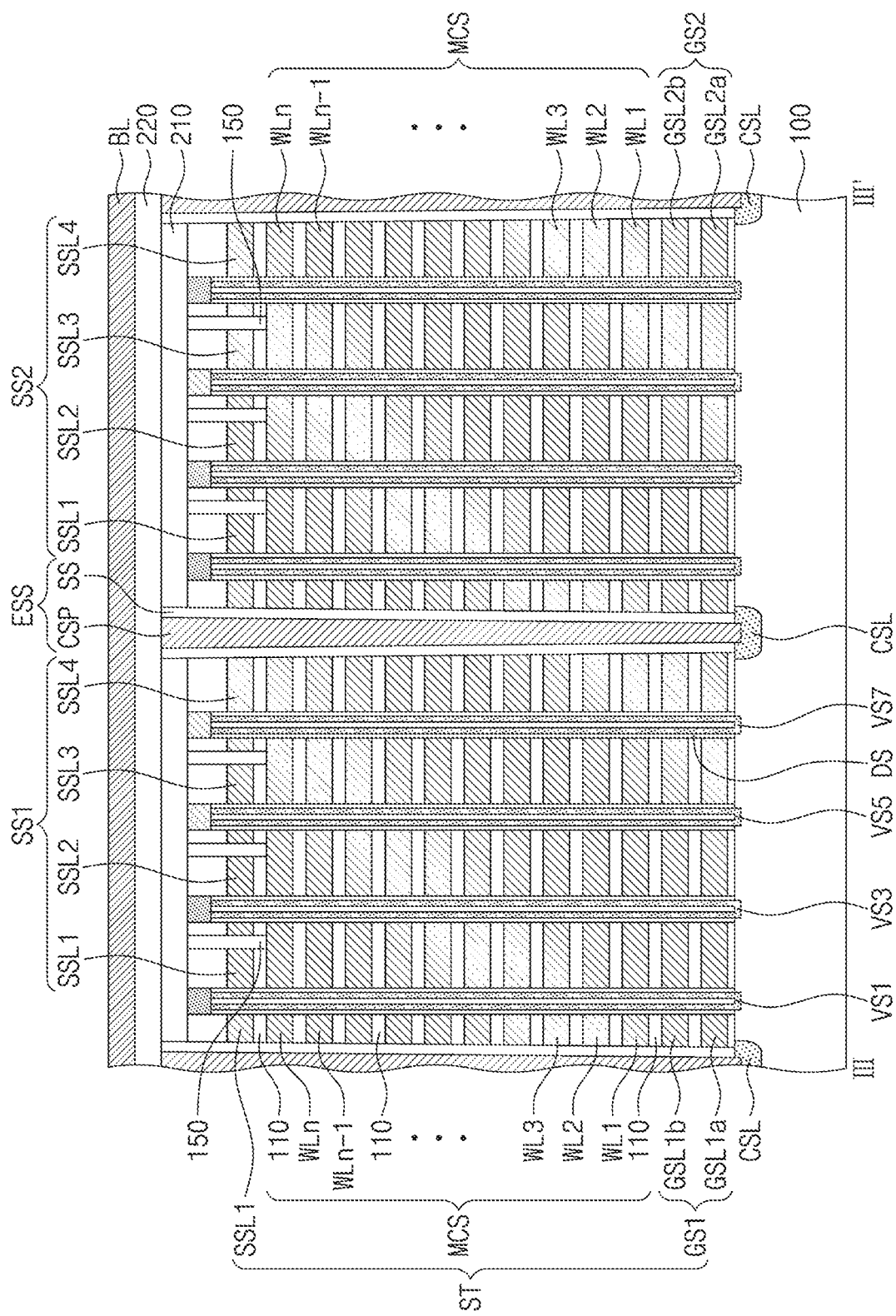
FIG. 9 is a sectional view taken along a line of FIG. 8.

FIG. 8 is a plan view illustrating the cell array of the three-dimensional semiconductor memory device of FIG. 6. FIG. 9 is a sectional view taken along a line of FIG. 8.

For concise description, an element, which is the same as that of the three-dimensional semiconductor memory device described with reference to FIGS. 4, 5A, and 5B, may be identified by the same reference number without repeating an overlapping description thereof.

Referring to FIGS. 8 and 9, the electrode structures ST, which are provided on the substrate 100, may be spaced apart from each other, in the second direction D2 crossing the first direction D1, by the electrode separation structure ESS. Each of the electrode structures ST may include the ground selection structure GS1 or GS2, the memory cell structure MCS on the ground selection structure GS1 or GS2, and the string selection structure SS1 or SS2 on the memory cell structure MCS.

The ground selection structure GS1 or GS2 may include a plurality of ground selection lines GSL1*a* and GSL1*b* or GSL2*a* and GSL2*b* stacked in the third direction D3, and the string selection structure SS1 or SS2 may include a plurality of string selection lines SSL1, SSL2, SSL3, and SSL4, which are extended in the first direction D1 and are spaced apart from each other in the second direction D2. As an example, each of the electrode structures ST may include first or second ground selection lines GSL1*a* and GSL1*b* or GSL2*a* and GSL2*b* and first, second, third, and fourth string selection lines SSL1, SSL2, SSL3, and SSL4. The first to fourth string selection lines SSL1-SSL4 may be spaced apart from each other by the insulating separation patterns 150, each of which is provided between them and is extended in the first direction D1.

In each of the word line blocks WLBLK1 and WLBLK2, the first to eighth vertical structures VS1-VS8 may be provided to penetrate each of electrode structures ST and may be connected to the substrate 100. In detail, the first and second vertical structures VS1 and VS2 may penetrate the first string selection line SSL1, the word lines WL1-WLn, and the first or second ground selection lines GSL1*a* and GSL1*b* or GSL2*a* and GSL2*b* of each of the electrode structures ST. The third and fourth vertical structures VS3 and VS4 may penetrate the second string selection line SSL2, the word lines WL1-WLn, and the first or second ground selection lines GSL1*a* and GSL1*b* or GSL2*a* and GSL2*b* of each of the electrode structure ST. The fifth and sixth vertical structures VS5 and VS6 may penetrate third string selection line SSL3, the word lines WL1-WLn, and the first or second ground selection lines GSL1*a* and GSL1*b* or GSL2*a* and GSL2*b* of each of electrode structures ST. The seventh and eighth vertical structures VS7 and VS8 may penetrate the fourth string selection line SSL4, the word lines WL1-WLn, and the first or second ground selection lines GSL1*a* and GSL1*b* or GSL2*a* and GSL2*b* of each of the electrode structures ST.

As described above, the data storage pattern DS may be extended in the third direction D3 to cross the side surfaces of the first and second ground selection lines GSL1*a*, GSL1*b*, GSL2*a*, and GSL2*b*, the word lines WL1-WLn, and the first to fourth string selection lines SSL1-SSL4.

The first and second ground selection transistors GST1 and GST2 described with reference to FIG. 6 may be composed of the first or second ground selection lines GSL1*a* and GSL1*b* or GSL2*a* and GSL2*b* as well as the data storage pattern DS and the vertical semiconductor pattern VP (e.g., see FIG. 19) adjacent thereto. Since each of the first and second ground selection transistors GST1 and GST2 includes the data storage pattern DS, the first and second ground selection transistors GST1 and GST2 may be programmed by voltages applied to the first or second ground selection lines GSL1*a* and GSL1*b* or GSL2*a* and GSL2*b*. A method of programming the first and second ground selection transistors GST1 and GST2 to different threshold voltages will be described in more detail below.

Figure 10:
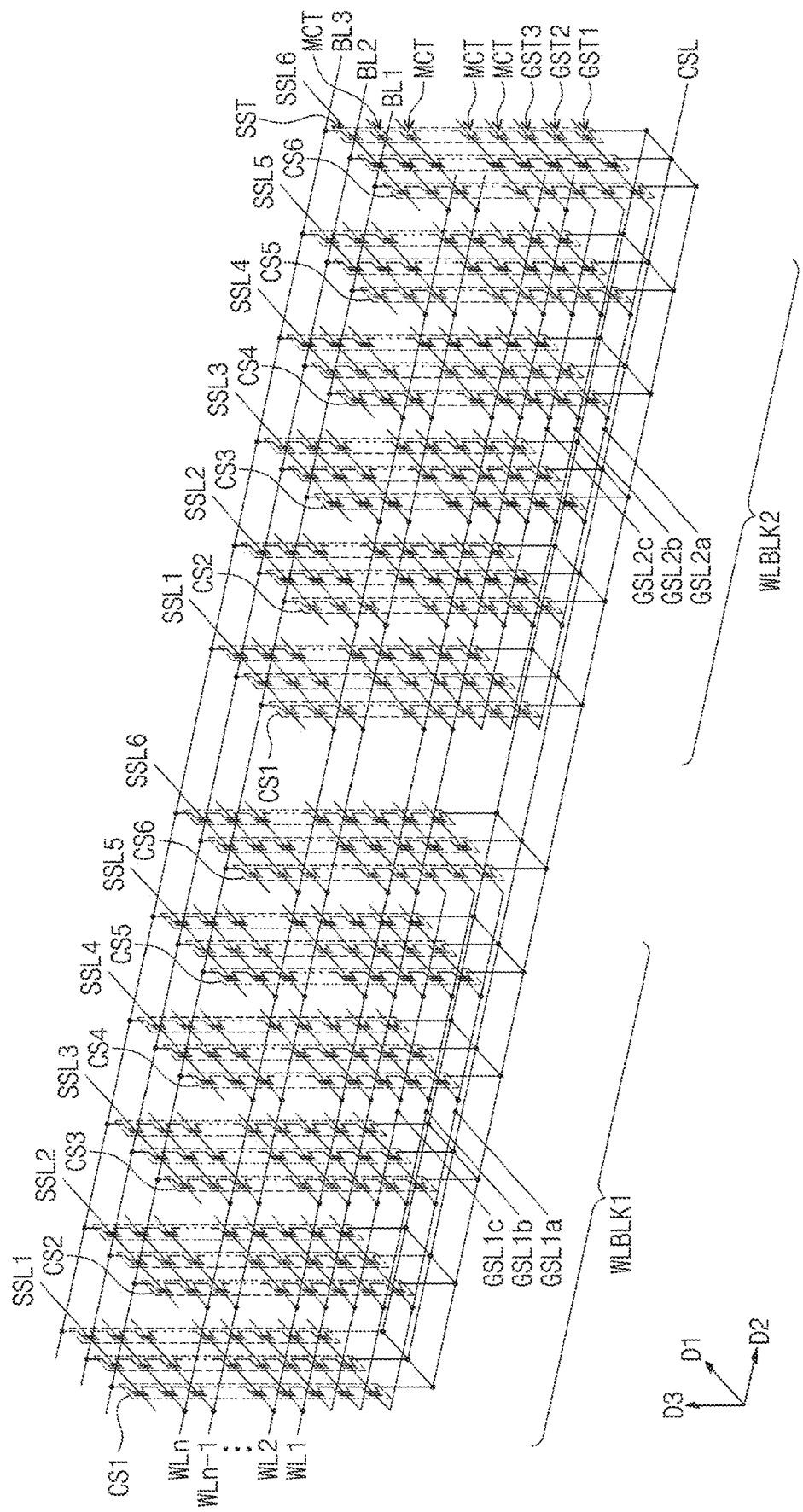
FIG. 10 is a circuit diagram illustrating a cell array of a three-dimensional semiconductor memory device, according to some embodiments of the inventive concepts.
Figure 11:
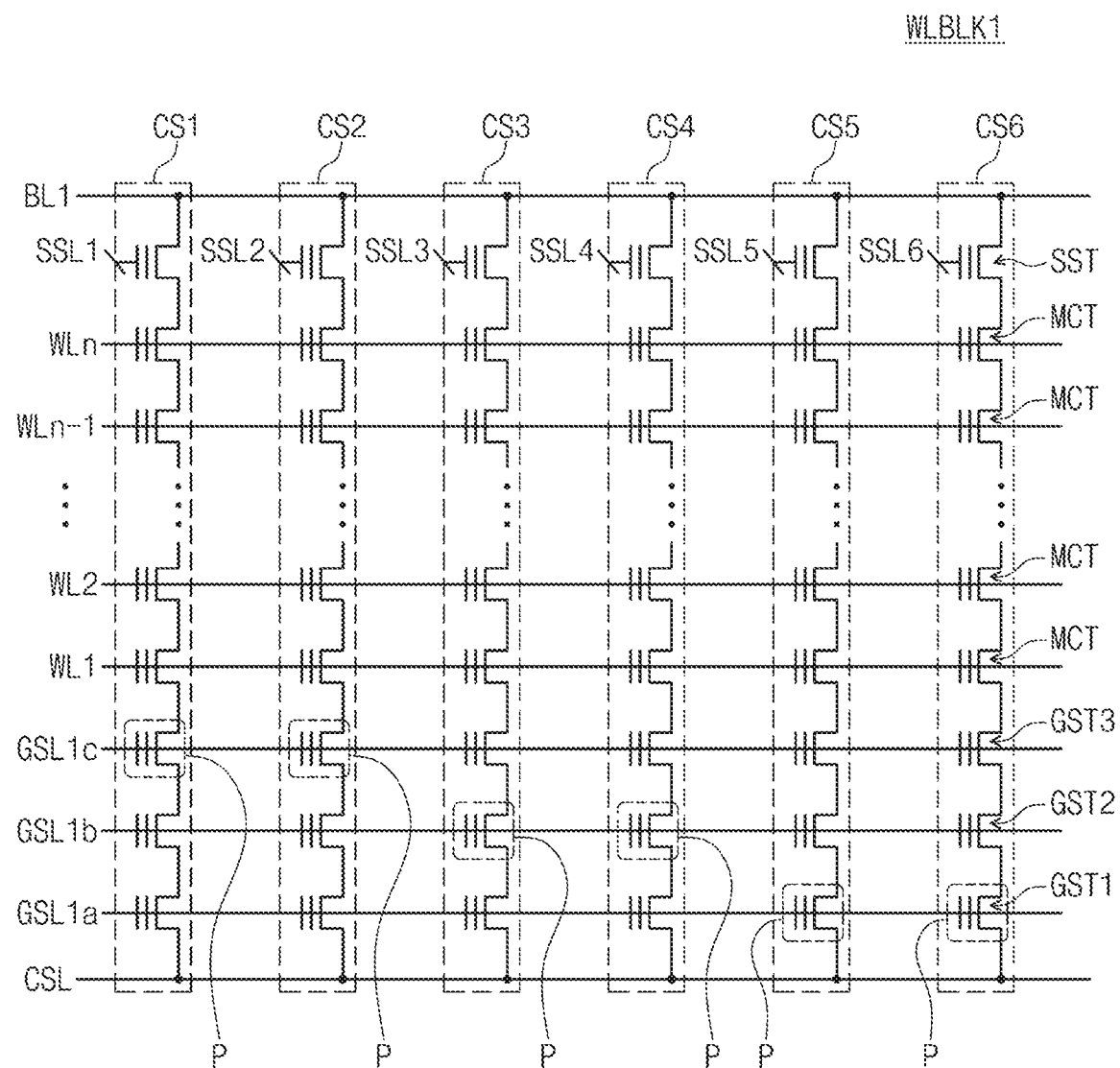
FIGS. 11 to 13 are circuit diagrams illustrating cell strings of the three-dimensional semiconductor memory device of FIG. 10.
Figure 12:
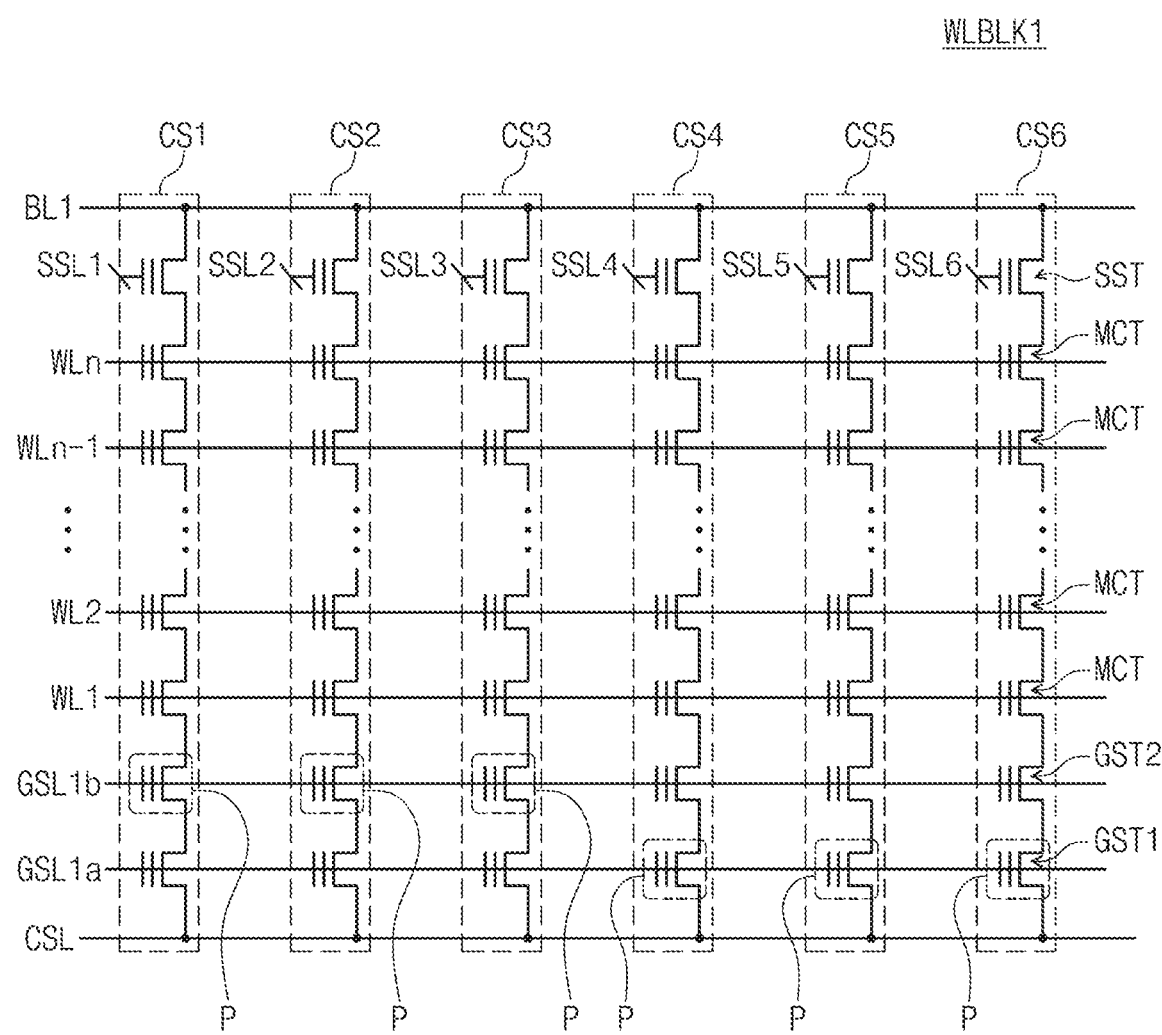
Figure 13:
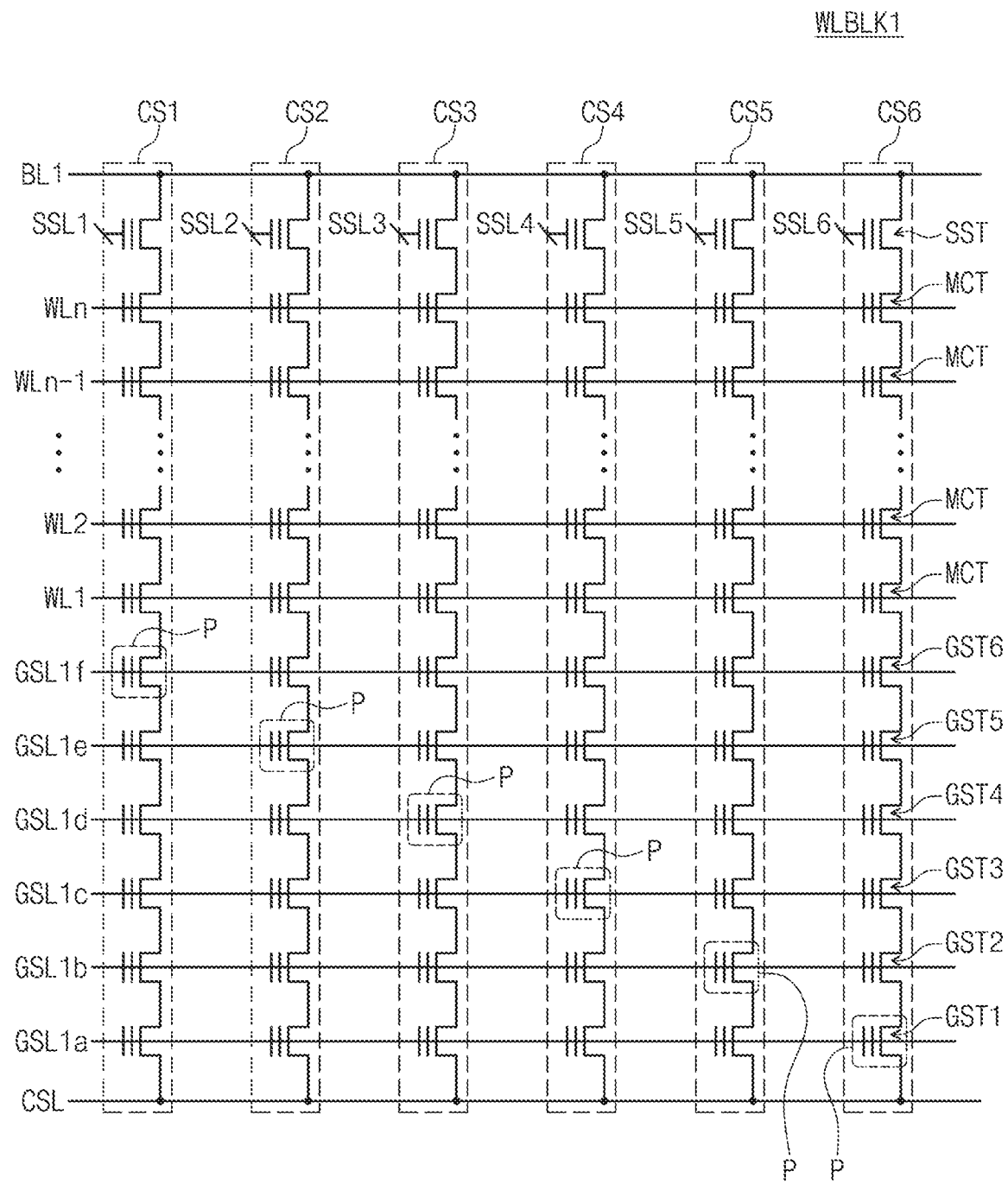

FIG. 10 is a circuit diagram illustrating a cell array of a three-dimensional semiconductor memory device, according to some embodiments of the inventive concepts. FIGS. 11 to 13 are circuit diagrams illustrating cell strings of the three-dimensional semiconductor memory device of FIG. 10.

Referring to FIGS. 10 and 11, the cell array may include the first and second word line blocks WLBLK1 and WLBLK2, and in each of the first and second word line blocks WLBLK1 and WLBLK2, first, second, third, fourth, fifth, and sixth cell strings CS1, CS2, CS3, CS4, CS5, and CS6 may be connected in parallel to each of the bit lines BL1-BL3.

Each of the first to sixth cell strings CS1-CS6 may include the string selection transistor SST, the memory cell transistors MCT connected in series, and a plurality of ground selection transistors GST1, GST2, and GST3 connected in series. As an example, each of the first to sixth cell strings CS1-CS6 may include two, three, or six ground selection transistors. Furthermore, in each cell string, at least one of the ground selection transistors GST1, GST2, and GST3 may have a threshold voltage different from the others.

As an example, each of the first to sixth cell strings CS1-CS6 may include first, second, and third ground selection transistors GST1, GST2, and GST3. In each of the first to sixth cell strings CS1-CS6, one of the first, second, and third ground selection transistors GST1, GST2, and GST3 may be programmed to have a second threshold voltage, and the others may be programmed to have a first threshold voltage lower than the second threshold voltage.

In each of the first and second word line blocks WLBLK1 and WLBLK2, the string selection transistors SST of the first to sixth cell strings CS1-CS6 may be controlled by the first to sixth string selection lines SSL1-SSL6, respectively.

The first, second, and third ground selection transistors GST1, GST2, and GST3 of the first to sixth cell strings CS1-CS6 of the first word line block WLBLK1 may be connected to first lower, intermediate, and upper ground selection lines GSL1a, GSL1b, and GSL1c, respectively.

The first, second, and third ground selection transistors GST1, GST2, and GST3 of the first to sixth cell strings CS1-CS6 of the second word line block WLBLK2 may be connected to second lower, intermediate, and upper ground selection lines GSL2a, GSL2b, and GSL2c, respectively.

In some embodiments, the first and second ground selection transistors GST1 and GST2 of the first and second cell strings CS1 and CS2 may have a first threshold voltage, and the third ground selection transistors GST3 of the first and second cell strings CS1 and CS2 may have a second threshold voltage higher than the first threshold voltage.

The first and third ground selection transistors GST1 and GST3 of the third and fourth cell strings CS3 and CS4 may have the first threshold voltage, and the second ground selection transistors GST2 of the third and fourth cell strings CS3 and CS4 may have the second threshold voltage higher than the first threshold voltage.

The second and third ground selection transistors GST2 and GST3 of the fifth and sixth cell strings CS5 and CS6 may have the first threshold voltage, and the first ground selection transistor GST1 of the fifth and sixth cell strings CS5 and CS6 may have the second threshold voltage higher than the first threshold voltage.

According to the embodiments shown in FIG. 11, when the first bit line BL1 is selected and the first cell string CS1 is electrically connected to the first bit line BL1 and the common source line CSL, the unselected third, fourth, fifth, and sixth cell strings CS3, CS4, CS5, and CS6 may be electrically disconnected from the common source line CSL and the first bit line BL1 by the second and third ground selection transistors GST2 and GST3.

According to the embodiments shown in FIG. 12, each of the first to sixth cell strings CS1-CS6, which are connected in parallel between the first bit line BL1 and the common source line CSL, may include the first and second ground selection transistors GST1 and GST2. Here, the first ground selection transistors GST1 of the first, second, and third cell strings CS1, CS2, and CS3 may have a first threshold voltage, and the second ground selection transistors GST2 of the first, second, and third cell strings CS1, CS2, and CS3 may have a second threshold voltage higher than the first threshold voltage. The second ground selection transistors GST2 of the fourth, fifth, and sixth cell strings CS4, CS5, and CS6 may have the first threshold voltage, and the first ground selection transistors GST1 of the fourth, fifth, and sixth cell strings CS4, CS5, and CS6 may have the second threshold voltage higher than the first threshold voltage.

In this case, when the first bit line BL1 is selected and the first cell string CS1 is electrically connected to the first bit line BL1 and the common source line CSL, the unselected fourth, fifth, and sixth cell strings CS4, CS5, and CS6 may be electrically disconnected from the common source line CSL by the second ground selection transistors GST2.

Referring to FIG. 13, each of the first to sixth cell strings CS1-CS6, which are connected in parallel between the first bit line BL1 and the common source line CSL, may include first to sixth ground selection transistors GST1, GST2, GST3, GST4, GST5, and GST6. In each of the first to sixth cell strings CS1-CS6, one of the first to sixth ground selection transistors GST1-GST6 may be programmed to have a second threshold voltage, and other ground selection transistors may be programmed to have a first threshold voltage less than the second threshold voltage.

As an example, the sixth ground selection transistor GST6 of the first cell string CS1, the fifth ground selection transistor GST5 of the second cell string CS2, the fourth ground selection transistor GST4 of the third cell string CS3, the third ground selection transistor GST3 of the fourth cell string CS4, the second ground selection transistor GST2 of the fifth cell string CS5, and the first ground selection transistor GST1 of the sixth cell string CS6 may be programmed to have the second threshold voltage higher than the first threshold voltage.

In each of the word line blocks WLBLK1 and WLBLK2, first to sixth ground selection lines GSL1a-GSL1f may be connected to the first to sixth ground selection transistors GST1-GST6, respectively, of each cell string CS1-CS6. In each of the word line blocks WLBLK1 and WLBLK2, the first ground selection transistor GST1 of the first to sixth cell strings CS1-CS6 may be electrically connected in common to the first ground selection line GSL1a. Except the first ground selection transistor GST1 of the sixth cell string CS6, all of the first ground selection transistors GST1 of the first to sixth cell strings CS1-CS6, which are connected to the first ground selection line GSL1a, may have a first threshold voltage. The second to sixth ground selection transistors GST2-GST6 of the first to sixth cell strings CS1-CS6 may be configured to have similar or the same features as the first ground selection transistors GST1.

According to the embodiments shown in FIG. 13, when the first bit line BL1 is selected and the first cell string CS1 is electrically connected to the first bit line BL1 and the common source line CSL, the unselected second to sixth cell strings CS2-CS6 may be electrically disconnected from the common source line CSL and the first bit line BL1 by the first to fifth ground selection transistors GST1-GST5 of the second to sixth cell strings CS2-CS6. In other words, the unselected second to sixth cell strings CS2-CS6 may be in an electrically floating state.

Figure 14:
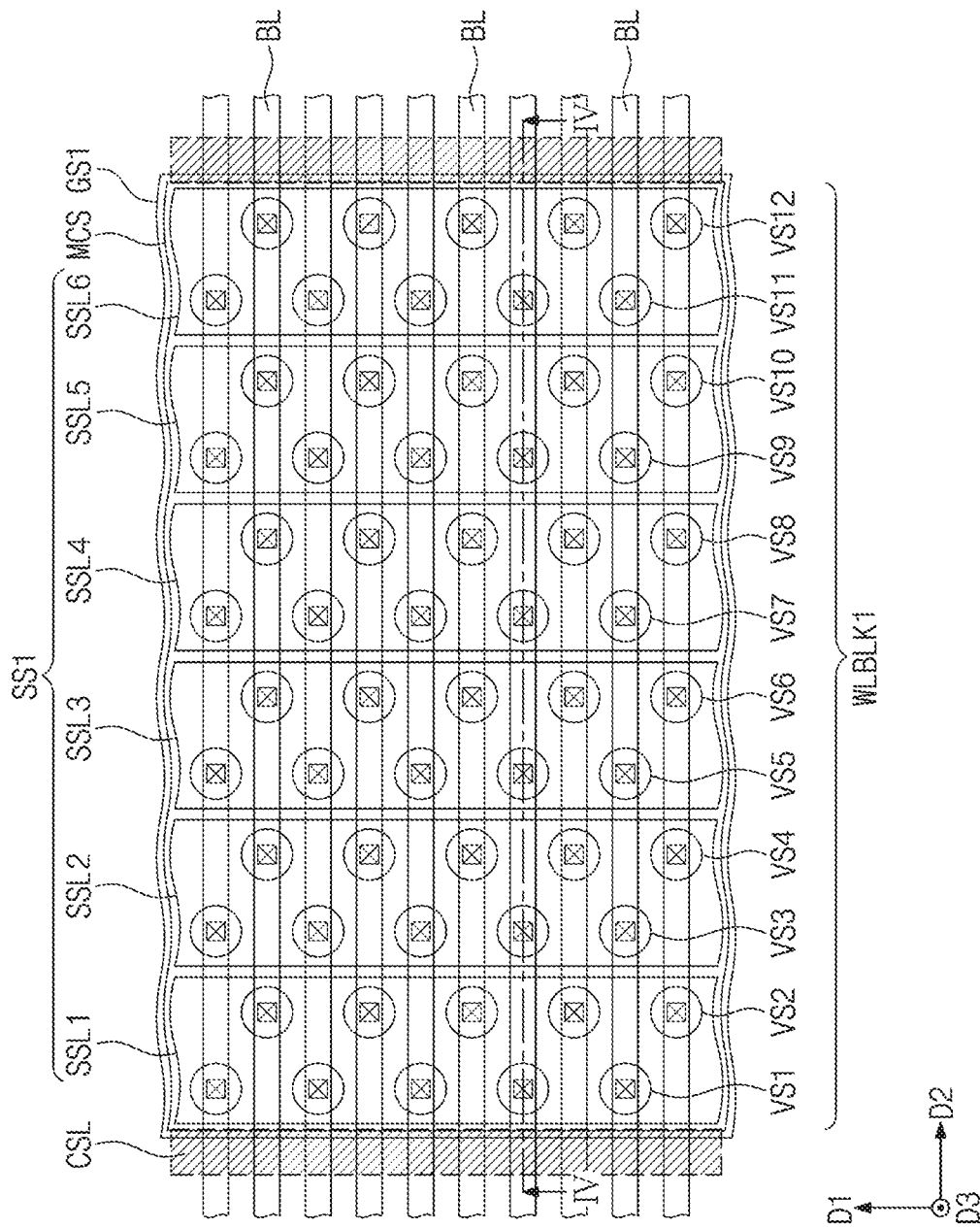
FIG. 14 is a plan view illustrating the cell array of the three-dimensional semiconductor memory device of FIG. 10.
Figure 15:
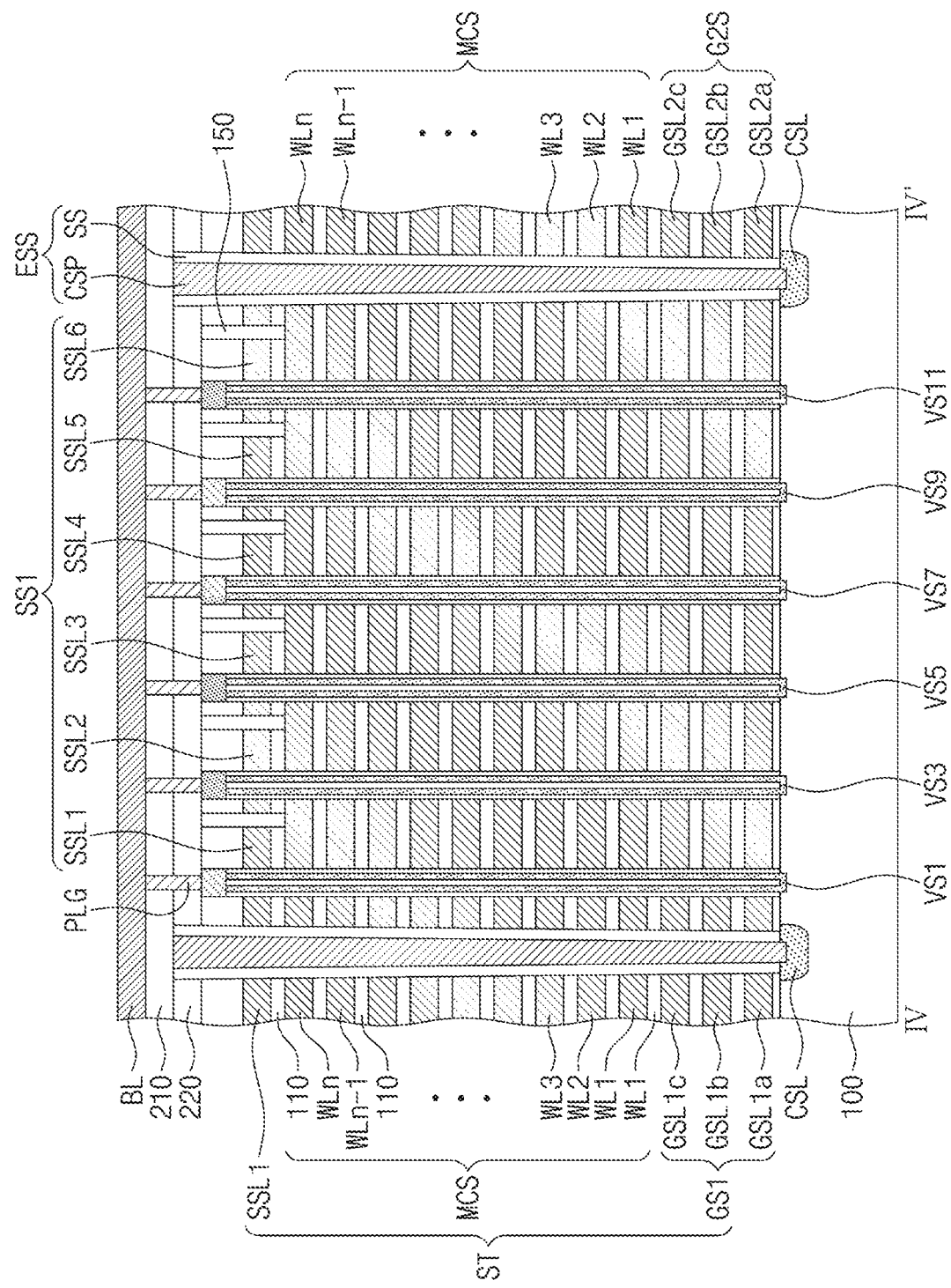
FIG. 15 is a sectional view taken along a line IV-IV' of FIG. 14.

FIG. 14 is a plan view illustrating the cell array of the three-dimensional semiconductor memory device of FIG. 10. FIG. 15 is a sectional view taken along a line IV-IV' of FIG. 14.

Referring to FIGS. 14 and 15, the electrode structures ST, which are provided on the substrate 100, may be spaced apart from each other, in the second direction D2 crossing the first direction D1, by the electrode separation structure ESS. Each of the electrode structures ST may include the ground selection structure GS1 or GS2, the memory cell structure MCT on the ground selection structure GS1 or GS2, and the string selection structure SS1 or SS2 on the memory cell structure MCT.

As an example, each of the electrode structures ST may include first, second, and third ground selection lines GSL1a, GSL1b, and GSL1c or GSL2a, GSL2b, and GSL2c and the first to sixth string selection lines SSL1, SSL2, SSL3, SSL4, SSL5, and SSL6. The first to sixth string selection lines SSL1, SSL2, SSL3, SSL4, SSL5, and SSL6 may be spaced apart from each other by the insulating separation patterns 150, each of which is provided between them and is extended in the first direction D1.

First to twelfth vertical structures VS1-VS12 may be provided to penetrate each of the electrode structures ST and may be connected to the substrate 100. In detail, the first and second vertical structures VS1 and VS2 may penetrate the first string selection line SSL1, the word lines WL1-WLn, and the first, second, and third ground selection lines GSL1a, GSL1b, and GSL1c or GSL2a, GSL2b, and GSL2c of each of the electrode structures ST. The third and fourth vertical structures VS3 and VS4 may penetrate the second string selection line SSL2, the word lines WL1-WLn, and the first, second, and third ground selection lines GSL1a, GSL1b, and GSL1c or GSL2a, GSL2b, and GSL2c of each of the electrode structures ST. The fifth and sixth vertical structures VS5 and VS6 may penetrate the third string selection line SSL3, the word lines WL1-WLn, and the first, second, and third ground selection lines GSL1a, GSL1b, and GSL1c or GSL2a, GSL2b, and GSL2c of each of the electrode structures ST. The seventh and eighth vertical structures VS7 and VS8 may penetrate the fourth string selection line SSL4, the word lines WL1-WLn, and the first, second, and third ground selection lines GSL1a, GSL1b, and GSL1c or GSL2a, GSL2b, and GSL2c of each of the electrode structures ST. The ninth and tenth vertical structures VS9 and VS10 may penetrate the fifth string selection line SSL5, the word lines WL1-WLn, and the first, second, and third ground selection lines GSL1a, GSL1b, and GSL1c or GSL2a, GSL2b, and GSL2c of each of the electrode structures ST. The eleventh and twelfth vertical structures VS11 and VS12 may penetrate the sixth string selection line SSL6, the word lines WL1-WLn, and the first, second, and third ground selection lines GSL1a, GSL1b, and GSL1c or GSL2a, GSL2b, and GSL2c of each of the electrode structures ST.

The data storage pattern DS may be extended in the third direction D3 to cross side surfaces of the first, second, and third ground selection lines GSL1a, GSL1b, GSL1c, GSL2a, GSL2b, and GSL2c, the word lines WL1-WLn, and the first to sixth string selection lines SSL1-SSL6.

The first to third ground selection transistors GS1-GST3 described with reference to FIGS. 10 and 11 may be composed of the first, second, and third ground selection lines GSL1a, GSL1b, GSL1c, GSL2a, GSL2b, and GSL2c as well as the data storage pattern DS, and the vertical semiconductor pattern VP (e.g., see FIG. 19) adjacent thereto. Since each of the first to third ground selection transistors GS1-GST3 includes the data storage pattern DS, the first to third ground selection transistors GS1-GST3 may be programmed by voltages applied to the first, second, and third ground selection lines GSL1a, GSL1b, GSL1c, GSL2a, GSL2b, and GSL2c. A method of programming the first to third ground selection transistors GS1-GST3 to different threshold voltages will be described in more detail below.

Figure 16:
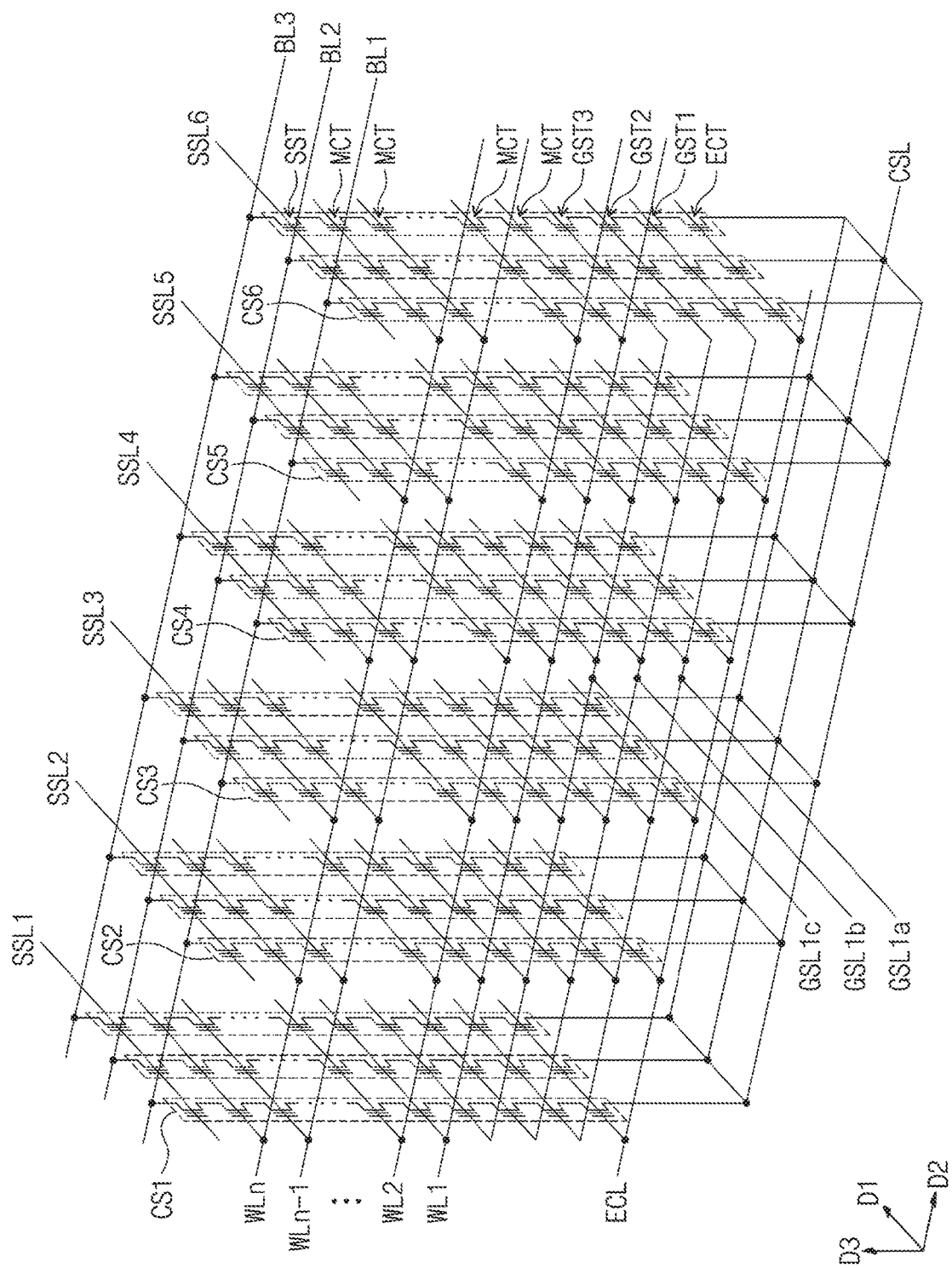
FIG. 16 is a circuit diagram illustrating a cell array of a three-dimensional semiconductor memory device according to some embodiments of the inventive concepts.

FIG. 16 is a circuit diagram illustrating a cell array of a three-dimensional semiconductor memory device according to some embodiments of the inventive concepts.

Referring to FIG. 16, each of the cell strings CS1-CS6 may be composed of the string selection transistor SST, the memory cell transistors MCT connected in series, a plurality of ground selection transistors GST1, GST2, and GST3 connected in series, and an erase control transistor ECT.

The erase control transistor ECT may be controlled by an erase control line ECL. The common source line CSL may be connected in common to sources of the erase control transistors ECT. The erase control transistors ECT of the first and second word line blocks WLBLK1 and WLBLK2 may be connected in common to the erase control line ECL and may be in an equipotential state.

During an erase operation of the memory cell array, the erase control transistors ECT may cause a gate induced drain leakage (GIDL) current. In some embodiments, during the erase operation of the memory cell array, an erase voltage may be applied to the bit lines BL1-BL3 and/or the common source line CSL, and the GIDL current may occur in the string selection transistor SST and/or the erase control transistor ECT.

Figure 17:
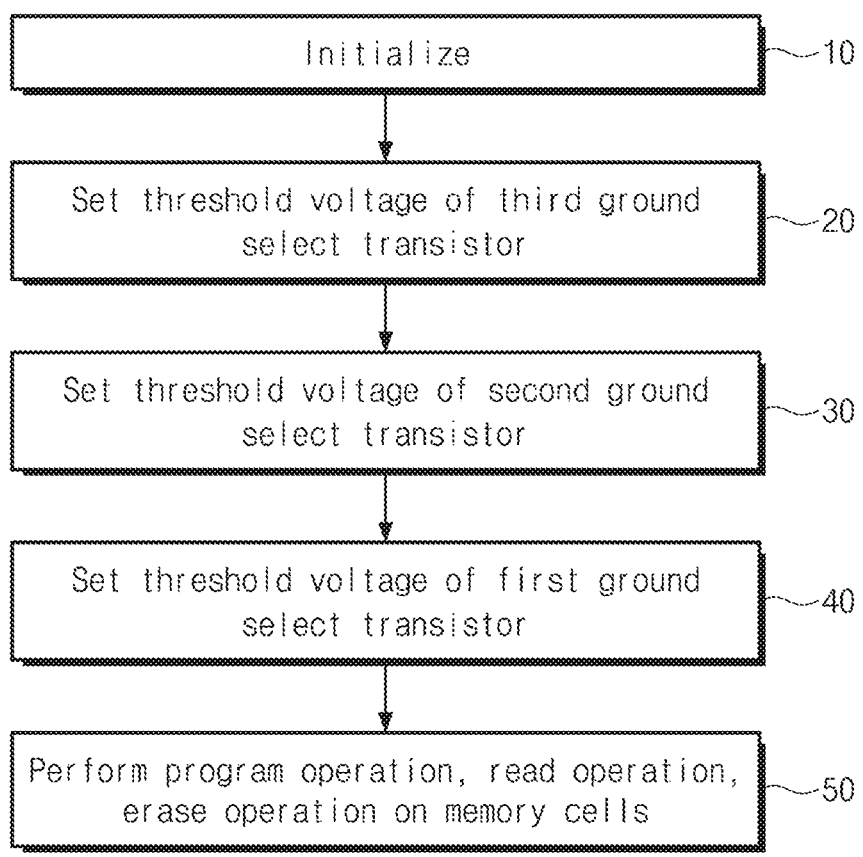
FIG. 17 is a flow chart illustrating a method of operating the three-dimensional semiconductor memory device described with reference to FIGS. 10 and 11.
Figure 18:
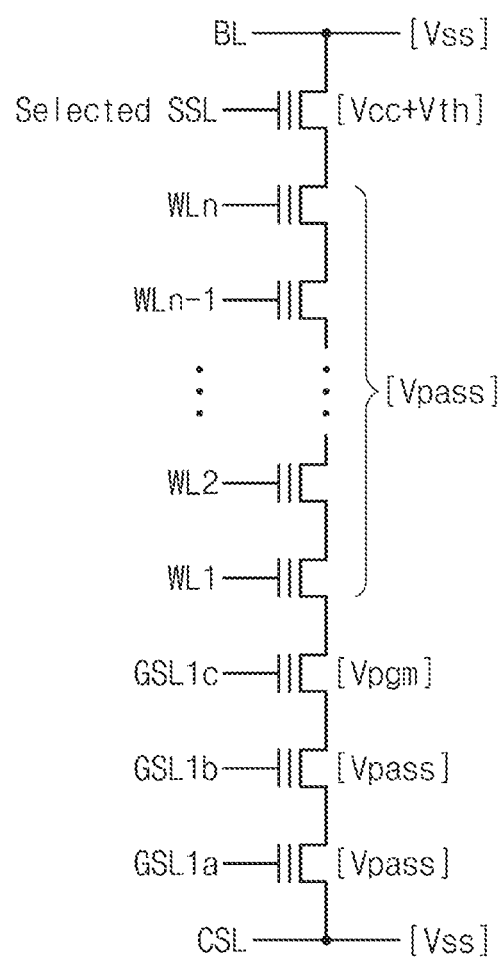
FIG. 18 is a circuit diagram illustrating a method of determining a threshold voltage of ground selection transistors, in a three-dimensional semiconductor memory device according to some embodiments of the inventive concepts.

FIG. 17 is a flow chart illustrating a method of operating the three-dimensional semiconductor memory device described with reference to FIGS. 10 and 11. FIG. 18 is a circuit diagram illustrating a method of determining a threshold voltage of ground selection transistors, in a three-dimensional semiconductor memory device according to some embodiments of the inventive concepts. FIG. 19 is a diagram illustrating a method of determining a threshold voltage of ground selection transistors, in a three-dimensional semiconductor memory device according to some embodiments of the inventive concepts. FIG. 20 is a table showing threshold voltages of the ground selection transistors, in the three-dimensional semiconductor memory device of FIGS. 10 and 11.

Referring to FIGS. 10, 11, 17, and 18, all memory blocks in the cell array may be initialized (in Block 10). In other words, the string and ground selection transistors SST, GST1, GST2 and GST3 and the memory cell transistors MCT of each memory block may be erased at the same time.

In detail, the string selection lines SSL1-SSL6, the ground selection lines GSL1a, GSL1b, GSL1c, GSL2a, GSL2b, and GSL2c, and the word lines WL1-WLn may be applied with a ground voltage Vss (FIG. 18), which may be 0V, and the substrate 100 and the vertical semiconductor pattern VP may be applied with an erase voltage. Here, the bit lines BL1-BL3 and the common source line CSL may be in an electrically floating state. The string and ground selection transistors SST, GST1, GST2 and GST3 may have a first threshold voltage that is lower than a voltage of 0V, as a result of the erase operation.

Thereafter, programming operations may be sequentially performed to program the first to third ground selection transistors GST1, GST2, and GST3 of the first to sixth cell strings CS1-CS6 to predetermined threshold voltages (in Blocks 20, 30, and 40).

In detail, referring to FIGS. 18 and 19, a first Vth-adjusting operation (in Block 20) may be performed to program the third ground selection transistors GST3 of the first and second cell strings CS1 and CS2 of each word line block to have a second threshold voltage.

In the first Vth-adjusting operation (in Block 20), the bit lines BL may be applied with the ground voltage Vss (e.g., 0V), and the first and second string selection lines SSL1 and SSL2 may be applied with a turn-on voltage Vcc+Vth, and the word lines WL1-WLn and the first lower and intermediate ground selection lines GSL1a and GSL1b may be applied with a pass voltage Vpass. The first upper ground selection line GSL1c may be applied with a program voltage Vpgm. Here, the program voltage Vpgm may be a voltage, which is high enough to cause an FN tunneling from the vertical semiconductor pattern VP. The pass voltage Vpass may be selected within a range from a threshold voltage of the memory cell transistor to the program voltage Vpgm.

Under such a voltage condition, the ground voltage Vss applied to the bit line BL may be delivered to the vertical semiconductor patterns VP of the first and second cell strings CS1 and CS2 to cause a large potential difference between the first upper ground selection line GSL1c, which is applied with the program voltage Vpgm, and the vertical semiconductor pattern VP of the first and second cell strings CS1 and CS2 adjacent thereto, and thus, electric charges may be trapped in the charge storing layer CIL adjacent to the first upper ground selection line GSL1c. Accordingly, the threshold voltages of the third ground selection transistors GST3 of the first and second cell strings CS1 and CS2 may be increased from the first threshold voltage to the second threshold voltage, as shown in FIG. 20.

Thereafter, a second Vth-adjusting operation (in Block 30) may be performed to program the second ground selection transistors GST2 of the third and fourth cell strings CS3 and CS4 of each word line block to the second threshold voltage.

In the second Vth-adjusting operation (in Block 30), the bit lines BL may be applied with the ground voltage Vss (e.g., 0V), and the third and fourth string selection lines SSL3 and SSL4 may be applied with the turn-on voltage Vcc+Vth, and the word lines WL1-WLn and the first lower and upper ground selection lines GSL1a and GSL1c may be applied with the pass voltage Vpass. The first intermediate ground selection line GSL1b may be applied with the program voltage Vpgm.

Under such a voltage condition, a large potential difference may occur between the first intermediate ground selection line GSL1b and the vertical semiconductor pattern VP of the third and fourth cell strings CS3 and CS4 adjacent thereto. Thus, electric charges may be trapped in the charge storing layer CIL adjacent to the first intermediate ground selection line GSL1b. Accordingly, the threshold voltage of the second ground selection transistors GST2 of the third and fourth cell strings CS3 and CS4 may be increased from the first threshold voltage to the second threshold voltage, as shown in FIG. 20.

Thereafter, a third Vth-adjusting operation (in Block 40) may be performed to program the first ground selection transistors GST1 of the fifth and sixth cell strings CS5 and CS6 of each word line block to the second threshold voltage.

In the third Vth-adjusting operation (in Block 40), the bit lines BL may be applied with the ground voltage Vss (e.g., 0V), and the fifth and sixth string selection lines SSL5 and SSL6 may be applied with the turn-on voltage Vcc+Vth, and the word lines WL1-WLn and first intermediate and upper ground selection lines GSL1b and GSL1c may be applied with the pass voltage Vpass. The first lower ground selection line GSL1a may be applied with the program voltage Vpgm.

Under such a voltage condition, a large potential difference may occur between the first lower ground selection line GSL1a and the vertical semiconductor pattern of the fifth and sixth cell strings CS5 and CS6 adjacent thereto. Thus, electric charges may be trapped in the charge storing layer adjacent to the first lower ground selection line GSL1a. Accordingly, the threshold voltage of the first ground selection transistors GST1 of the fifth and sixth cell strings CS5 and CS6 may be increased from the first threshold voltage to the second threshold voltage, as shown in FIG. 20.

If in each word line block, threshold voltages of the first to third ground selection transistors GST1-GST3 of the first to sixth cell strings CS1-CS6 are set as shown in FIG. 20, then one of programming, reading, and erase operations may be performed on the memory cell transistors MCT of the memory cell array (in Block 50).

FIG. 21 is a table showing voltage conditions to select a cell string in the programming and reading operations of the three-dimensional semiconductor memory device of FIG. 10.

Referring to FIGS. 10 and 21, one of the first to sixth cell strings CS1-CS6 may be selected to program or read data in or from a selected memory cell.

In the case where the first or second cell string CS1 or CS2 is selected, a selected bit line may be applied with the ground voltage, and the first or second string selection line SSL1 or SSL2 may be applied with the power voltage Vcc. An unselected bit line may be applied with a predetermined bit line voltage, and the unselected string selection lines SSL3-SSL6 may be applied with the ground voltage Vss (e.g., 0V). The first upper ground selection line GSL1c may be applied with a second operation voltage Vgs12, which is higher than the second threshold voltage, and the first lower and intermediate ground selection lines GSL1a and GSL1b may be applied with a first operation voltage Vgs11, which is higher than the first threshold voltage and is lower than the second threshold voltage.

Under such a voltage condition, the third ground selection transistor GST3 of the first or second cell string CS1 or CS2 may be turned on, and the first and second ground selection transistors GST1 and GST2 may be turned on. Thus, a current flow may be formed between the selected bit line and the common source line CSL through the first or second cell string CS1 or CS2.

At this time, the first to third ground selection transistors GST1-GST3 of the unselected third to sixth cell strings CS3-CS6 may be turned off. In other words, during the reading or programming operation on the memory cell array, the unselected cell strings CS3-CS6 of the first to sixth cell strings CS1-CS6 connected to the selected bit line may be electrically disconnected from the selected bit line and the common source line CSL and may become in a floating state.

Meanwhile, in the case where the third or fourth cell string CS3 or CS4 is selected, the first intermediate ground selection line GSL1b may be applied with the second operation voltage Vgs12, which is higher than the second threshold voltage, and the first lower and upper ground selection lines GSL1a and GSL1c may be applied with the first operation voltage Vgs11, which is higher than the first threshold voltage and is lower than the second threshold voltage.

In the case where the fifth or sixth cell string CS5 or CS6 is selected, the first lower ground selection line GSL1a may be applied with the second operation voltage Vgs12, which is higher than the second threshold voltage, and the first intermediate and upper ground selection lines GSL1b and GSL1c may be applied with the first operation voltage Vgs11, which is higher than the first threshold voltage and is lower than the second threshold voltage.

According to some embodiments of the inventive concept, ground selection transistors in each of cell strings may be programmed to adjust respective threshold voltages thereof. This may make it possible to electrically separate ground selection transistors, which are connected to one ground selection line, from each other. Accordingly, it may be possible to secure operational reliability and to increase the number of cell strings provided in each word line block.

Though example embodiments of the inventive concepts have been particularly shown and described, it will be understood by one of ordinary skill in the art that variations in form and detail may be made therein without departing from the scope of the attached claims.

What is claimed is:

1. A three-dimensional (3D) semiconductor memory device comprising a plurality of word line blocks including a plurality of cell strings that are connected in parallel between a bit line and a common source line,
    wherein each of the cell strings comprises a plurality of memory cell transistors that are stacked on a substrate in a vertical direction, a plurality of ground selection transistors that are connected in series between the plurality of memory cell transistors and the substrate, and a string selection transistor that is between the plurality of memory cell transistors and the bit line,
    wherein, in each of the word line blocks, the string selection transistors of the cell strings are electrically separated from each other, and ones of the ground selection transistors that are located at a same vertical level are controlled in common, and
    wherein, in each of the cell strings, at least one of the plurality of ground selection transistors has a first threshold voltage, and remaining ones of the ground selection transistors have a second threshold voltage different from the first threshold voltage.

2. The 3D semiconductor memory device of claim 1, wherein a first ground selection transistor and a second ground selection transistor of the ones of the ground selection transistors that are located at the same vertical level have the first threshold voltage and the second threshold voltage, respectively.

3. The 3D semiconductor memory device of claim 1,
    wherein, in each of the word line blocks, the cell strings comprise n cell strings,
    wherein each of the cell strings comprises m ground selection transistors, and
    wherein the m is a natural number that is equal to or greater than the n.

4. The 3D semiconductor memory device of claim 1,
    wherein, in each of the word line blocks, the cell strings comprise six cell strings, and
    wherein each of the cell strings comprises first, second, and third ground selection transistors that are connected in series to each other.

5. The 3D semiconductor memory device of claim 4, wherein the cell strings comprise a first cell string in which the first ground selection transistor has the first threshold voltage, a second cell string in which the second ground selection transistor has the first threshold voltage, and a third cell string in which the third ground selection transistor has the first threshold voltage.

6. The 3D semiconductor memory device of claim 5, wherein the first, second, and third ground selection transistors of the first, second, and third cell strings are connected to first, second, and third ground selection lines, respectively.

7. The 3D semiconductor memory device of claim 5, wherein the first, second, and third ground selection transistors of the first, second, and third cell strings are at different respective levels from the substrate.

8. A three-dimensional (3D) semiconductor memory device comprising:
    a substrate;
    first and second cell strings connected in common to a bit line, each of the first and second cell strings comprising:
        a plurality of memory cell transistors that are stacked on the substrate in a vertical direction;
        first and second ground selection transistors that are connected in series between the plurality of memory cell transistors and the substrate; and
        a string selection transistor that is between the plurality of memory cell transistors and the bit line;
    a first string selection line connected to the string selection transistor of the first cell string;
    a second string selection line connected to the string selection transistor of the second cell string;
    a first ground selection line connected in common to the first ground selection transistors of the first and second cell strings; and
    a second ground selection line connected in common to the second ground selection transistors of the first and second cell strings,
    wherein, in each of the first and second cell strings, the first and second ground selection transistors have respective threshold voltages that are different from each other.

9. The 3D semiconductor memory device of claim 8,
    wherein the threshold voltage of the first ground selection transistor of the first cell string is different from the threshold voltage of the first ground selection transistor of the second cell string, and
    wherein the threshold voltage of the second ground selection transistor of the first cell string is different from the threshold voltage of the second ground selection transistor of the second cell string.

10. The 3D semiconductor memory device of claim 8, wherein, in the first and second cell strings, ones of the memory cell transistors that are located at a same level from the substrate are connected in common to one word line.

11. The 3D semiconductor memory device of claim 8,
    wherein the first ground selection transistors of the first and second cell strings are located at a first level from the substrate, and
    wherein the second ground selection transistors of the first and second cell strings are located at a second level from the substrate that is higher than the first level.

12. The 3D semiconductor memory device of claim 8,
    wherein the first and second ground selection lines are vertically stacked on the substrate, and
    wherein the first and second string selection lines are horizontally spaced apart from each other on the substrate.

13. The 3D semiconductor memory device of claim 12, wherein the first cell string comprises:
   a first vertical semiconductor pattern that vertically penetrates the first string selection line and the first and second ground selection lines; and
   a first data storage pattern that is between the first and second ground selection lines and the first vertical semiconductor pattern, and
wherein the second cell string comprises:
   a second vertical semiconductor pattern that vertically penetrates the second string selection line and the first and second ground selection lines; and
   a second data storage pattern that is between the first and second ground selection lines and the second vertical semiconductor pattern.

14. The 3D semiconductor memory device of claim 13, wherein each of the first and second data storage patterns comprises a tunnel insulating layer, a charge storing layer, and a blocking insulating layer that are sequentially stacked on sidewalls of the first and second vertical semiconductor patterns.

15. The 3D semiconductor memory device of claim 13, wherein electric charges are trapped in the first data storage pattern between the first ground selection line and the first vertical semiconductor pattern and are trapped in the second data storage pattern between the second ground selection line and the second vertical semiconductor pattern.

16. A three-dimensional (3D) semiconductor memory device comprising:
   a substrate;
   a cell electrode structure including word lines vertically stacked on the substrate, wherein the cell electrode structure comprises a plurality of word line blocks that each comprise:
      a plurality of ground selection electrodes vertically stacked between the word lines and the substrate,
   wherein the plurality of ground selection electrodes comprises a first ground selection line connected to a lowermost ground selection transistor of a first cell string and to a lowermost ground selection transistor of a second cell string, and a second ground selection line connected to an uppermost ground selection transistor of the first cell string and to an uppermost ground selection transistor of the second cell string,
   wherein the uppermost ground selection transistor of the first cell string has a different threshold voltage from the uppermost ground selection transistor of the second cell string, and
   wherein the lowermost ground selection transistor of the first cell string has a different threshold voltage from the lowermost ground selection transistor of the second cell string; and
      a plurality of string selection electrodes that are on the word lines and are horizontally spaced apart from each other,
   a plurality of vertical semiconductor patterns penetrating the word lines, the ground selection electrodes, and the string selection electrodes; and
   data storage patterns between the ground selection electrodes and the vertical semiconductor patterns.

17. The 3D semiconductor memory device of claim 16, wherein each of the data storage patterns comprises a tunnel insulating layer, a charge storing layer, and a blocking insulating layer that are sequentially stacked on sidewalls of the vertical semiconductor patterns.

18. The 3D semiconductor memory device of claim 16, wherein the plurality of string selection electrodes overlap the ground selection electrodes.

19. The 3D semiconductor memory device of claim 16,
   wherein the first and second ground selection lines comprise first and second ground selection electrodes, respectively,
   wherein the plurality of string selection electrodes comprise first and second string selection electrodes,
   wherein the plurality of vertical semiconductor patterns comprise first and second vertical semiconductor patterns,
   wherein the data storage patterns comprise first and second data storage patterns,
   wherein the first vertical semiconductor pattern penetrates the first string selection electrode and the first and second ground selection electrodes,
   wherein the first data storage pattern is between the first and second ground selection electrodes and the first vertical semiconductor pattern,
   wherein the second vertical semiconductor pattern penetrates the second string selection electrode and the first and second ground selection electrodes, and
   wherein the second data storage pattern is between the first and second ground selection electrodes and the second vertical semiconductor pattern.

20. The 3D semiconductor memory device of claim 16, wherein the plurality of string selection electrodes comprises a first string selection electrode of the first cell string and a second string selection electrode of the second cell string.

* * * * *